US007254680B2

(12) United States Patent
Ayukawa et al.

(10) Patent No.: US 7,254,680 B2

(45) Date of Patent: Aug. 7, 2007

(54) SEMICONDUCTOR INTEGRATED CIRCUIT AND DATA PROCESSING SYSTEM

(75) Inventors: Kazushige Ayukawa, Kokubunji (JP); Seiji Miura, Hachioji (JP); Jun Satoh, Musashino (JP); Takao Watanabe, Fuchu (JP); Kazumasa Yanagisawa, Kokubunji (JP); Yusuke Kanno, Hachioji (JP); Hiroyuki Mizuno, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/641,808

(22) Filed: Dec. 20, 2006

(65) Prior Publication Data

US 2007/0101088 A1 May 3, 2007

Related U.S. Application Data

(63) Continuation of application No. 11/010,324, filed on Dec. 14, 2004, now Pat. No. 7,165,151, which is a continuation of application No. 10/729,934, filed on Dec. 9, 2003, now Pat. No. 6,847,578, which is a continuation of application No. 10/101,063, filed on Mar. 20, 2002, now Pat. No. 6,708,249, which is a continuation of application No. 09/342,240, filed on Jun. 29, 1999, now Pat. No. 6,381,671.

(30) Foreign Application Priority Data

Jul. 1, 1998 (JP) ................................ 10-185778

(51) Int. Cl.
*G06F 12/00* (2006.01)
*G11C 7/00* (2006.01)

(52) U.S. Cl. .......................... 711/149; 711/3; 711/100; 711/154; 365/230.05

(58) Field of Classification Search .................... 711/3, 711/100, 104, 117, 118, 149, 154; 365/189.02, 365/230.03, 230.05
See application file for complete search history.

(56) References Cited

U.S. PATENT DOCUMENTS 4,445,177 A 4/1984 Bratt et al.
4,937,781 A 6/1990 Lee et al.
5,390,308 A 2/1995 Ware et al.

(Continued)

FOREIGN PATENT DOCUMENTS

EP 0-639835 2/1995

(Continued)

*Primary Examiner*—Tuan V. Thai
(74) *Attorney, Agent, or Firm*—Mattingly, Stanger, Malur & Brundidge PC

(57) ABSTRACT

To enhance the speed of first access (read access different in word line from the previous access) to a multi-bank memory, multi-bank memory macro structures are used. Data are held in a sense amplifier for every memory bank. When access is hit to the held data, data latched by the sense amplifier are output to thereby enhance the speed of first access to the memory macro structures. Namely, each memory bank is made to function as a sense amplifier cache. To enhance the hit ratio of such a sense amplifier cache more greatly, an access controller self-prefetches the next address (an address to which a predetermined offset has been added) after access to a memory macro structure so that data in the self-prefetched address are preread by a sense amplifier in another memory bank.

7 Claims, 19 Drawing Sheets

U.S. PATENT DOCUMENTS 5,404,338 A 4/1995 Murai et al.
5,619,676 A 4/1997 Fukuda et al.
5,649,144 A 7/1997 Gostin et al.
5,706,244 A 1/1998 Shimizu
5,742,841 A 4/1998 DeRoo et al.
5,774,409 A 6/1998 Yamazaki et al.
5,828,615 A 10/1998 Mukunoki et al.
5,890,207 A 3/1999 Sne et al.
5,890,219 A 3/1999 Scaringella et al.
5,999,480 A * 12/1999 Ong et al. ............. 365/230.06
6,067,265 A 5/2000 Mukunoki et al.
6,094,370 A * 7/2000 Takashima .................. 365/145
6,098,109 A 8/2000 Kotzur et al.
6,108,015 A 8/2000 Cross
6,118,724 A 9/2000 Higginbottom
6,145,027 A 11/2000 Seshan et al.
6,173,356 B1 1/2001 Rao
6,263,390 B1 7/2001 Alasti et al.
6,282,145 B1 * 8/2001 Tran et al. ............. 365/230.06
6,285,626 B2 9/2001 Mizuno et al.
6,311,234 B1 10/2001 Seshan et al.
6,317,364 B1 11/2001 Guterman et al.
6,329,997 B1 12/2001 Wu et al.
6,401,176 B1 6/2002 Fadavi-Ardekani et al.
6,469,948 B2 10/2002 Mizuno et al.
6,480,424 B1 11/2002 Issa

FOREIGN PATENT DOCUMENTS

JP 5-12110 1/1993
JP 10-65124 3/1998

* cited by examiner

CPU
FIRST LEVEL CACHE MEMORY
INTERFACE CIRCUIT FOR EXTERNAL BUS
ACCESS OPTIMIZER
DRAM MACRO
DRAM MACRO
DRAM MACRO
DRAM MACRO
5Ma
5Mb
5Mc
5Md
6
4
PT2
RT1
9ACB
9DBa
9DBb
9DBc
9DBd
(128bit)
10DB (128bit)
11AB
11DB (32bit)
6AB
6DB (32bit)
7AB
7DB (32bit)
8AB
8DB (32bit)
1
2
3

F I G. 3
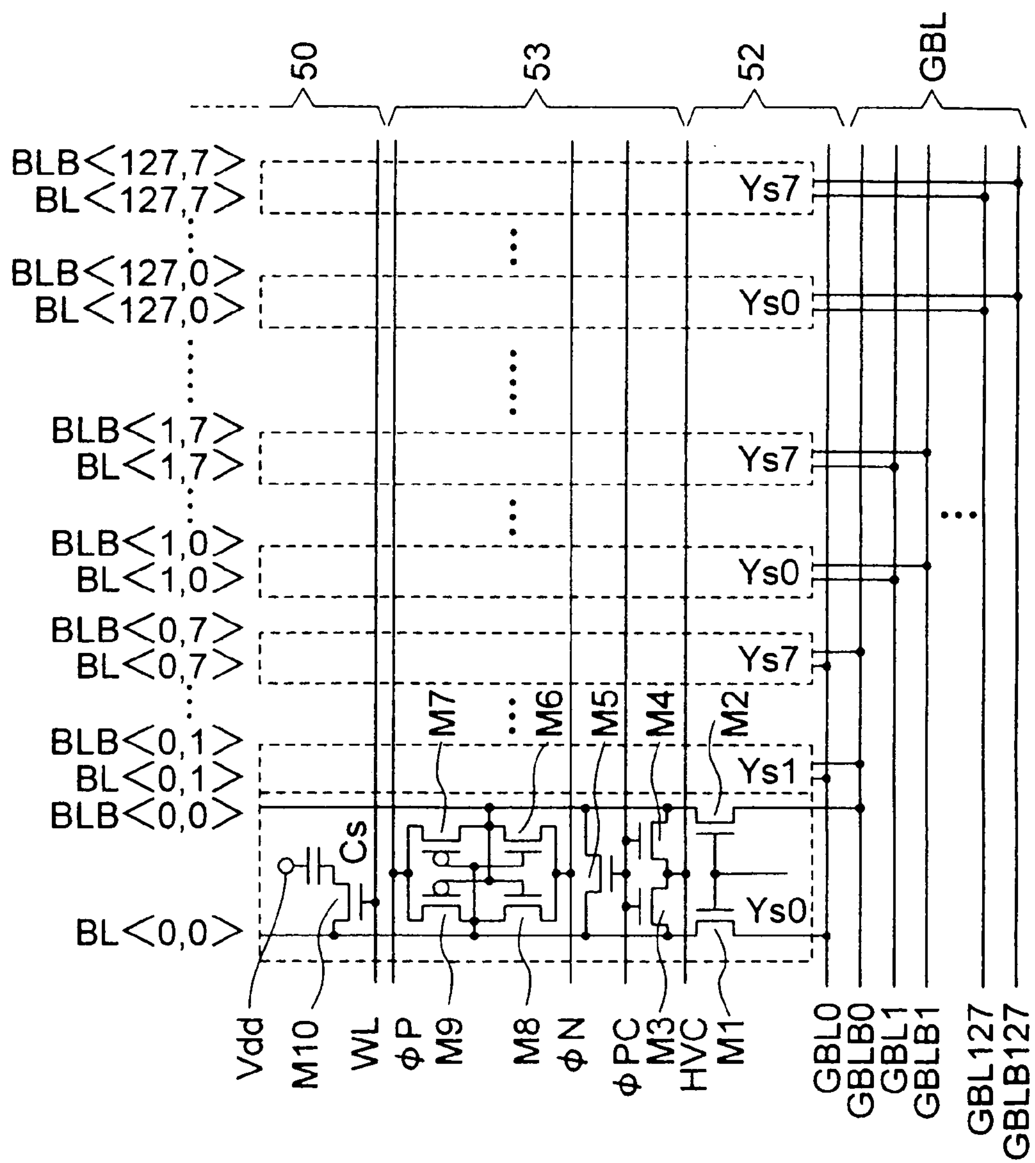

L1-CACHE(4WAY)
ATAG
INDEX
LINE
SIZE
A0
A2
A3
A4
A11
A12
A31
CACHE LINE
SELECTION BITS
2
20
21
22
23
24
25
26
WAY3
WAY2
WAY1
WAY0
LW0
LW1
LW2
LW3
V
CTAG
(0)
(1)
(255)
CMP
HIT
32BIT
DATA

INDEX
LINE SIZE
ATAG
A31
R7
R2
R1
R0
B3
B2
B1
B0
MS1
MS0
C2
C1
C0
DATA BITS(128BITS)
COLUMN SELECTION BITS
DRAM MACRO SELECTION BITS
DRAM BANK SELECTION BITS
LW0
LW1
LW2
LW3
128BIT
DATA
5Ma~5Md
SACTAG
(0)
(1)
(255)
CMP
HIT
43
6

5Ma
5Mb
5Mc
5Md
DRAM MACRO
DRAM MACRO
DRAM MACRO
DRAM MACRO
(128BITS)
9DBa
9DBb
9DBc
9DBd
45
SELECTION SIGNAL
450R
451R
452W
453W
SELECTION SIGNAL
READ DATA BUFFER
READ DATA BUFFER
WRITE DATA BUFFER
WRITE DATA BUFFER
454R
455R
454W
455W
(128BITS)
(128BITS)
(32BITS)
(32BITS)
10DB
11DB

FIG. 18A
ADDRESS INPUT aA (6AB)
ADDRESS INPUT aB (11AB)
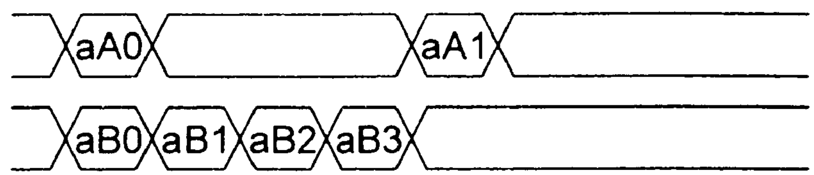
FIG. 18B
DATA(10DB)
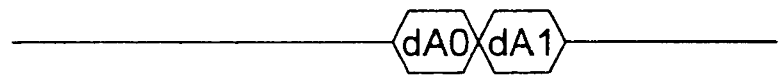
DATA(11DB) dB0 dB1 dB2 dB3
FIG. 18C
WAIT MISS WAIT HIT
DATA(10DB) dA0 dA1
DATA(11DB) dB0 dB1 dB2 dB3
HIT HIT HIT HIT
FIG. 18D
MISS HIT
DATA(10DB)
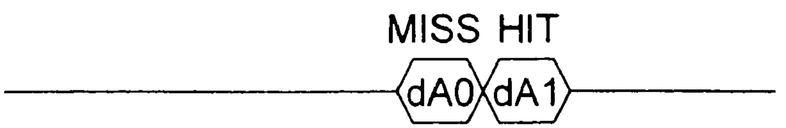
DATA(11DB) dB0 dB1 dB2 dB3
HIT HIT HIT WAIT HIT WAIT

SEMICONDUCTOR INTEGRATED CIRCUIT AND DATA PROCESSING SYSTEM

CROSS-REFERENCE TO RELATED APPLICATIONS

This is a continuation application of U.S. Ser. No. 11/010,324, filed Dec. 14, 2004, now U.S. Pat. No. 7,165,151, which is a continuation of U.S. Ser. No. 10/729,934, filed Dec. 9, 2003, now U.S. Pat. No. 6,847,578, which is a continuation application of U.S. Ser. No. 10/101,063, filed Mar. 20, 2002, now U.S. Pat. No. 6,708,249, which is a continuation application of U.S. Ser. No. 09/342,240 filed Jun. 29, 1999, now U.S. Pat. No. 6,381,671.

BACKGROUND OF THE INVENTION

The present invention relates to a semiconductor integrated circuit in which memories are integrated. Particularly, it relates to a semiconductor integrated circuit in which a logic circuit such as a CPU (central processing unit) is integrated with a large-capacity memory in one chip. For example, it relates to a useful technique adapted for embedded DRAM which is integrated with a CPU and a first level cache memory in one and the same chip.

Today, a semiconductor integrated circuit in which a large-scale logic circuit is integrated with a large-capacity memory in one chip is provided. In such a semiconductor integrated circuit, the number of bus bits for connecting the memory and the logic circuit to each other can be increased easily, for example, to 128 in order to enhance data throughput between the memory and the logic circuit. Accordingly, there is an advantage in that data can be transferred at a high speed while electric power consumption required for data input/output is suppressed compared with the case where input/output pins outside the chip are driven.

Multi-bank DRAM (Dynamic Random Access Memory) can be used as the large-capacity memory. In the multi-bank DRAM, a sense amplifier is provided in accordance with every memory bank, so that data once latched by the sense amplifier on the basis of a word line selecting operation can be output successively at a high speed by a simple means for changing-over a column switch. Accordingly, data access to continuous addresses in one and the same page (one and the same word line address) can be made relatively speedily. Data access to different pages (at page-miss) is, however, made slow because of bit line precharge, or the like.

Further, in the multi-bank DRAM, page-miss can be hidden under a predetermined condition. That is, when a read or write command is generated to operate a certain memory bank and another memory bank is to be used next, an activation command can be given to the next memory bank in advance to make a word line selecting operation precedently. Of course, for this reason, the CPU must make access to the addresses sequentially. It is, however, substantially impossible to define this entirely by a CPU operation program, or the like.

In semiconductor integrated circuits, there is also that in which a cache memory integrated with a large-capacity memory and a large-scale logic circuit such as a CPU, or the like. In the semiconductor integrated circuit of this type, the difference in operating speed between the large-capacity memory and the CPU is relaxed by the cache memory so that data can be processed at a high speed by the CPU. That is, among data stored in the large-capacity memory, a part of data used recently by the CPU and data in its vicinity are held in the high-speed cache memory. The data processing speed is enhanced when the memory access of the CPU is hit to the cache memory. However, when a miss occurs once, access to the large-capacity memory is made. As a result, data processing speed of the CPU is limited.

An example of literature on the multi-bank DRAM is JP-A-10-65124 corresponding to U.S. patent application Ser. No. 08/813,900 filed Mar. 7, 1997 and U.S. patent application Ser. No. 09/188,367 filed Nov. 10, 1998, a continuation application of application Ser. No. 08/813,900, the whole disclosure of which is incorporated herein by reference.

As described above, even in the multi-bank DRAM, page-miss is not always hidden in accordance with a sequence of access addresses. Even in the case where a cache memory is provided for the multi-bank DRAM, the situation is quite the same if cache-miss occurs. Therefore, the necessity of improving the access speed to the multi-bank memory more greatly has been found by the inventor.

SUMMARY OF THE INVENTION

A first object of the present invention is to enhance the speed of first access to a multi-bank memory, that is, the speed of read access different in word line from the previous access.

A second object of the present invention is to prevent lowering of the operating efficiency of a multi-bank memory having a plurality of banks which are able to operate parallelly when both cache entry replace and write back are caused by cache-miss of a cache memory provided for the multi-bank memory. That is, address information corresponding to an index address in an address signal is made identical between an operation in which data in a cache line to be written back are written in a multi-bank memory and an operation in which new cache entry data to be written in the same cache line as described above are read from the multi-bank memory. When information of the index address is mapped in memory bank selection address information, data having the index addresses arranged as one and the same address are arranged in one and the same memory bank. Accordingly, both a read operation for replacing the cache line with new one and a write operation for write back must be performed on one and the same memory bank. Accordingly, the two operations cannot be performed efficiently by use of different memory banks.

A third object of the present invention is to make non-blocking multi-access possible in a semiconductor integrated circuit having a plurality of multi-bank memory macro structures in which a plurality of access requests without conflict among the memory macro structures are allowed so that one access does not block another access.

A fourth object of the present invention is to enhance the efficiency of data rewrite to a multi-bank DRAM having a cache line with every word line. That is, the inventor has found that, when the cache line is provided as a rewrite unit, there is no necessity of performing read modify write to apply write data after storage information read out to a bit line by a word line selecting operation is latched by a sense amplifier, in the same manner as in a general DRAM.

The foregoing and other objects and novel features of the present invention will become clear from the following description and the accompanying drawings.

Main features in embodiments of the present invention contain the following features.

<1> Next Address Self-Prefetching

A multi-bank memory macro structure is used and data are held in a sense amplifier in every memory bank. When access is hit to the data held in the sense amplifier, data latched by the sense amplifier are output so that the speed of first access to the memory macro structure can be made high. That is, every memory bank is made to function as a sense amplifier cache. To enhance the hit ratio of the sense amplifier cache (the ratio of hit on the data of the sense amplifier) more greatly, after access to one memory bank, the next address (obtained by addition of a predetermined offset) is self-prefetched so that data in the self-prefetching address is preread by a sense amplifier in another memory bank. The next address is used as a subject of self-prefetching on the basis of an empirical rule that CPU operation programs or a group of processing data are basically mapped on linear addresses.

A semiconductor integrated circuit for achieving the aforementioned next address self-prefetching comprises memory macro structures 5Ma to 5Md, and an access controller 4. Each of the memory macro structures has a plurality of memory banks BANK1 to BANK4 having bank addresses allocated thereto respectively. Each of the memory banks has a sense amplifier 53 for latching storage information read out to a bit line BL from a memory cell in a word line WL selected on the basis of a row address signal R-ADD. The bit line is selected on the basis of a column address signal Ys0 to Ys7. The selected bit line is connected to a data line GBL of the memory macro structure. The access controller includes an address/command generating unit 44 for generating the address/command and being able to operate for every memory bank, a hit/miss judgment unit 43 for enabling data already latched by the sense amplifier to be output to the data line in response to an access request after the data latching, and an address self-prefetching unit 42 for self-prefetching an access address having a predetermined offset to an external access address after access control of the memory macro structure to the external access address so that data in the self-prefetching address is preread from a corresponding memory cell of the memory macro structure.

The self-prefetching address must be an address in a memory bank different from a subject of access just before the self-prefetching address. If the two addresses are in one and the same memory bank, the function of a sense amplifier cache cannot be used for the preceding access. For this reason, the access address having a predetermined offset to the external access address is provided as an address for designating a memory bank different from the memory bank designated by the external access address. From a different point of view, the address signal generated by the address/command generating unit is formed so that a bank address signal B0 to B3 is mapped on the high order side of a column address signal C0 to C2, a row address signal R0 to R7 is mapped on the high order side of the bank address signal, and the predetermined offset is 2 to the power i from the least significant bit of the column address signal when i is the number of bits in the column address signal.

The hit/miss judgment unit for the sense amplifier cache function can be formed so as to have comparators 432A and 432B for detecting coincidence/anticoincidence between the external access address and the storage information access address held in the sense amplifier. The address/command generating unit can be formed so as to give an instruction to the memory macro structure designated by the external access address to select the memory bank, the word line and the bit line in response to anticoincidence detected by the comparator and give an instruction to the memory macro structure designated by the external access address to stop the word line selecting operation and select the memory bank and the bit line in response to coincidence detected by the comparator.

<2> Address Alignment Control for Second Level Cache

When the CPU 1 is connected to the access controller 4 and a set associative type first level cache memory 2 is connected both to the CPU and to the access controller, the access controller and the memory macro structures can be provided as a second level cache memory 6 based on the sense amplifier cache function thereof. Those as a whole may be configured as a multi-chip data processing system. There is some case where both replace of the cache line concerning cache-miss with new one and write back of the cache line are required because of cache-miss of the first level cache memory. In this case, index addresses for the first level cache memory are made identical to each other between an operation in which data in the cache line concerning the cache-miss of the first level cache memory are written back to the second level cache memory and an operation in which cache entry data to be substituted for the cache line concerning the cache-miss are read from the second level cache memory. If memory bank address information for the second level cache memory is the same as index address information for the first level cache memory, data in index addresses identical to each other are arranged in one and the same memory bank on the second level cache memory. Accordingly, both a read operation for replacing the cache line with new one and a write operation for write back must be performed for one and the same memory bank. Accordingly, the two operations cannot be performed efficiently by use of different memory banks.

Therefore, an address alignment control unit 41 is provided in the access controller for changing the bit alignment of an access address signal supplied from the outside to output the changed bit alignment to the memory macro structure. For example, the address alignment control unit is provided to allocate the alignment of an address signal supplied from the CPU and different from the alignment of a plurality of address bits allocated to the index address of the first level cache memory to the bank address of the memory bank. As a result, cache entry replacement caused by cache-miss of the first level cache memory can be performed without lowering of the operating efficiency of the multi-bank memory.

From another point of view, the address alignment control unit is provided to change at least the whole or a part of the alignment of address information contained in an address signal provided from the CPU, which is used as the index address of the first level cache memory to allocate the changed alignment to the bank address of the memory bank. For example, the address alignment control unit is provided so that a part of address information contained in an address signal supplied from the CPU and used as an index address of the first level cache memory and a part of address information used as a tag address are replaced with each other to allocate the address information to the bank address of the memory bank.

As another example of address alignment by the address alignment control unit, at least low order 2 bits of the tag address of the first level cache memory contained in the address signal supplied from the CPU can be allocated to an address for designating the memory bank and/or an address for designating the memory macro structure. Alternatively, at least low order 2 bits of the index address of the first level cache memory contained in the address signal supplied from the CPU can be allocated to an address for designating the memory bank and/or an address for designating the memory macro structure. Further, at least low order 2 bits of the index address of the first level cache memory contained in the address signal supplied from the CPU can be allocated to the column address signal.

The address alignment control unit may contain a switch circuit 411 for making the alignment change of address information variable, and a control register 410 for latching control information for determining the switch state of the switch circuit. Access to the control register can be performed by the CPU. The difference in address alignment appears as the difference in frequency of designation of one and the same memory bank with respect to continuous addresses. If the frequency of selection of one and the same memory bank with respect to index addresses close to each other is high at the time of cache line replacing, the hit ratio of information due to the sense amplifier cache function becomes lower as access address are closer to each other. If the frequency of selection of different memory banks with respect to index addresses close to each other is high at the time of cache line replacing, the hit ratio of information due to the sense amplifier cache function becomes higher as access address are closer to each other. Which is selected advantageously depends on the address mapping of data/command. One of the two can be selected in accordance with an application system.

If the simplification of configuration is put first, wiring having address alignment fixed by a metal option can be used as the address alignment control unit.

<3> Write without Data Readout in Second Level Cache Memory Constituted by DRAM Macro Structures For writing data in DRAM, generally, data is once read from a memory cell to a sense amplifier and then a part of data is rewritten. That is, read modify write is performed. When the sense amplifier cache function of the DRAM macro structures is used as a second level cache memory, there is no necessity of performing read modify write because data are managed by word lines. Therefore, for writing, transfer of write data from a write amplifier to a bit line is started at the same time or just after rising of a word line without the read operation of the sense amplifier, so that one-word-line's data are written at a high speed.

The cache memory for achieving the aforementioned write without data readout comprises DRAM macro structures 5Ma to 5Md, and an access controller 4. Each of the DRAM macro structures has a plurality of memory banks BANK1 to BANK4 having bank addresses allocated thereto respectively. Each of the memory banks has a sense amplifier 53 for latching storage information read out to a bit line from a memory cell in a word line WL selected on the basis of a row address signal R-ADD. The bit line BL is selected on the basis of a column address signal C-ADD. The selected bit line is connected to a data line GBL of the corresponding DRAM macro structure. The access controller includes an address/command generating unit 44 for generating the address/command and being able to operate for every memory bank, and a hit/miss judgment unit 43 for making it possible to output data already latched by the sense amplifier to the data line in response to an access request after the data latching. Each of the memory banks has a first operation mode for activating the sense amplifier at first timing after selection of the word line, and a second operation mode for activating the sense amplifier at second timing slower than the first timing after selection of the word line. The first operation mode is a write without data readout mode. The second operation mode is a refresh mode. A data processing system can be configured by using the aforementioned cache memory as a second level cache memory and by using a first level cache memory and a CPU for the second level cache memory.

<4> Parallel Access to Non-Conflicting Memory Macro Structures

In a semiconductor integrated circuit in which a plurality of multi-bank memory macro structures are integrated, non-blocking multi-access can be provided for a plurality of access requests without conflict among memory macro structures so that one access does not block another access. The memory 6 for achieving this access comprises an access controller 4 having a first access port PT1 and a second access port PT2, and a plurality of memory macro structures 5Ma to 5Md connected to the access controller through data lines 9DBa to 9DBd respectively. Each of the memory macro structures has a plurality of memory banks BANK1 to BANK4 having bank addresses allocated thereto respectively. Each of the memory banks has a sense amplifier 53 for latching storage information read out to a bit line BL from a memory cell in a word line WL selected on the basis of a row address signal R-ADD. The bit line is selected on the basis of a column address signal C-ADD. The selected bit line is connected to a data line GBL of the memory macro structure. The access controller includes selectors 450R, 451R, 452W and 453W for selecting a memory macro structure accessed through the first access port and a memory macro structure accessed through the second access port, an access priority judgment unit 40 permitting parallel access through the two access ports when both the access through the first access port and access through the second access port use different memory macro structures respectively, an address/command generating unit 44 for generating the address/command and being able to operate for every memory bank in the memory macro structure to be accessed, and a hit/miss judgment unit 43 for making it possible to output data latched by the sense amplifier to the data line in response to an access request after the data latching.

For conflicting memory macro priority control, the access priority judgment unit can be formed so that the operation of an access port having higher priority determined in advance is performed preferentially when both the access through the first access port and access through the second access port use one and the same memory macro structure.

Further, the first access port and/or second access port can have an SRAM interface function. Latency from address input to data output changes in accordance with the state of access. To cope with this, an SRAM interface which is able to output a wait signal, or the like, in a period from address input to data output is used in the first and second access ports more simply than an interface having fixed latency.

A data processing system using the memory 6 comprises the memory 6, a combination of a first address bus 6AB and a first data bus 10DB connected to the first access port of the memory, a combination of a second address bus 11AB and a second data bus 11DB connected to the second access port of the memory, a CPU 1 connected both to the first address bus and to the first data bus, and a bus interface circuit 3 connected both to the second address bus and to the second data bus.

Alternatively, a data processing system using the memory comprises the memory 6, a combination of a first address bus 6AB and a first data bus 10DB connected to the first access port of the memory, a combination of a second address bus 11AB and second data bus 11DB connected to the second access port of the memory, a combination of a CPU 1 and a first level cache memory 2 connected both to the first address bus and to the first data bus, and a bus master 7 connected both to the second address bus and to the second data bus, wherein the memory is used as a second level cache memory for the first level cache memory.

BRIEF DESCRIPTION OF THE DRAWINGS

FIG. 3 is a circuit diagram showing an example of configuration of connection of DRAM banks to global bit lines;

FIGS. 18A to 18D are timing charts showing some examples of operation timing of the DRAM macro structures in accordance with a result of the access priority judgment;

DETAILED DESCRIPTION OF THE PREFERRED EMBODIMENTS

<System LSI>

Figure 1:
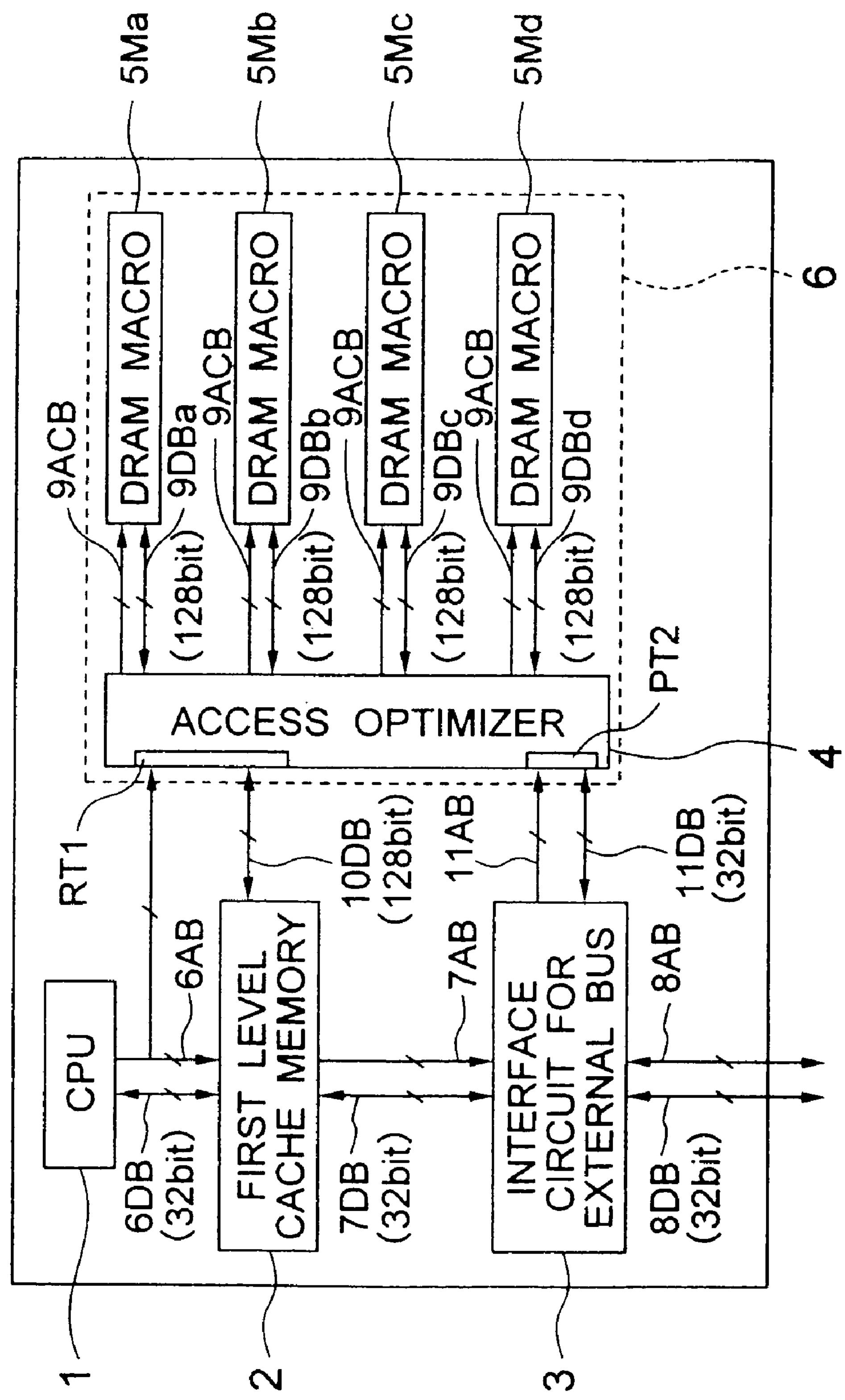
FIG. 1 is a block diagram of an LSI integrating DRAM and CPU (system LSI) as an example of a semiconductor integrated circuit according to the present invention.

FIG. 1 shows an LSI integrating DRAM and CPU (referred to as system LSI) which is an example of a semiconductor integrated circuit according to the present invention. The system LSI shown in FIG. 1 is not limited specifically. A CPU 1 as an example of a large-scale logic circuit, a first level cache memory 2, an interface circuit 3 for external bus, an access optimizer 4 and a plurality of DRAM macro structures (multi-bank DRAMs) 5Ma to 5Md as an example of a large-capacity memory are integrated in one chip such as a monocrystalline silicon chip by a CMOS (Complementary Metal Oxide Semiconductor) producing technique. The DRAM macro structures 5Ma to 5Md are constituted by multi-bank DRAMs which have a plurality of DRAM banks (memory banks) respectively. The DRAM banks are provided with shared global bit lines. Each of the DRAM banks has a sense amplifier cache function using a sense amplifier as a cache. For access hit to data in the sense amplifier, data can be output at a high speed without any word line selecting operation. Both the hit/miss judgment for the sense amplifier cache and the control of the DRAM macro structures 5Ma to 5Md are performed by the access optimizer 4.

The CPU 1 is not limited specifically. But, for example, a so-called 32-bit CPU may be used. The data processing unit of the CPU is made 32 bits as a general rule. Further, the CPU 1 can manage a 4-Gbyte address space on the basis of a 32-bit address signal though it is not limited specifically.

The CPU 1 and the first level cache memory 2 are connected to each other by a 32-bit internal data bus 6DB and a 32-bit internal address bus 6AB. The first level cache memory 2 and the interface circuit 3 for external bus are connected to each other by a 32-bit internal data bus 7DB and a 32-bit internal address bus 7AB. The interface circuit 3 for external bus is connected to the outside through a 32-bit external data bus 8DB and a 32-bit external address bus 8AB. Incidentally, control signal buses are not shown in FIG. 1.

The DRAM macro structures 5Ma to 5Md are mapped in the address space of the CPU 1. The DRAM macro structures are used as a second level cache memory due to the sense amplifier cache function thereof. The DRAM macro structures 5Ma to 5Md input/output data from/to the access optimizer 4 through 128-bit memory data buses 9DBa to 9DBd. The access optimizer 4 supplies an address signal, a command, or the like, to a corresponding DRAM macro structure through a bus 9ACB.

The access optimizer 4 is connected both to the CPU 1 and to the first level cache memory 2 through a first access port PT1. The access optimizer 4 further has a second access port PT2 for connecting the access optimizer 4 to the outside of the system LSI through the external bus interface circuit 3. The first access port PT1 receives an address signal from the CPU 1 through the address bus 6AB. Data input/output between the first access port PT1 and the first level cache memory 2 is performed through a 128-bit data bus 10DB. The second access port PT2 is connected to the external bus interface circuit 3 through a 32-bit address bus 11AB and a 32-bit data bus 11DB.

When the CPU 1 in the system LSI outputs an address signal to the address bus 6AB to perform read access, the first level cache memory 2 starts a cache memory operation such as hit/miss judgment, or the like, in response to the read access. Concurrently, also the access optimizer 4 starts sense amplifier cache hit/miss judgment, or the like. The first level cache memory 2 is a small-capacity high-speed memory made of SRAM (Static Random Access Memory). Each of the DRAM macro structures 5Ma to 5Md is a large-capacity low-access-speed memory compared with the first level cache memory 2. Accordingly, the cache hit/miss judgment for the first level cache memory 2 always precedes that for the DRAM macro structures. If the first level cache memory 2 is in a cache-hit state, the output of read data from the DRAM macro structures 5Ma to 5Md by the access optimizer 4 is suppressed and necessary data are given from the first level cache memory 2 to the CPU 1 through the data bus 6DB. If the first level cache memory 2 is in a cache-miss state, necessary data are given from the DRAM macro structures 5Ma to 5Md to the CPU 1 through the data bus 10DB and the first level cache memory 2. In this occasion, the data given from the DRAM macro structures 5Ma to 5Md to the first level cache memory 2 is composed of 128 bits. The first level cache memory 2 extracts 32 bits by use of the low order side of the address signal and gives the 32 bits to the CPU 1. At the same time, the first level cache memory 2 writes the aforementioned 128-bit data in a cache line concerning cache-miss to thereby perform cache-fill of the cache line. When the cache line in this condition holds data effective for write back, an operation of writing data of the cache line back to a corresponding address of the DRAM macro structures 5Ma to 5Md is performed before cache-fill.

In the case of write access by the CPU 1, data is written in the cache memory 2 if the first level cache memory 2 is in a cache-hit state. If the first level cache memory 2 is in a cache-miss state, data is written in a corresponding address of the DRAM macro structures 5Ma to 5Md. Data write to the DRAM macro structures 5Ma to 5Md is performed through the bus 10DB.

Data transfer between each of the DRAM macro structures 5Ma to 5Md embedded in the system LSI and the outside of the LSI is performed through the external bus interface circuit 3 and the buses 11DB and 11AB. Access control in this condition can be performed by a not-shown DMAC (Direct Memory Access Controller) disposed in the outside of the LSI, or the like.

In the system LSI, the cache memory 2 is disposed between the CPU 1 as a large-scale logic circuit and the DRAM macro structures 5Ma to 5Md as a large-capacity memory. Accordingly, the difference between the operating speed of the large-capacity memory 5Ma to 5Md and the operating speed of the CPU 1 is relaxed by the cache memory 2 so that high-speed data processing of the CPU 1 is realized. Further, to enhance data throughput between the DRAM macro structures 5Ma to 5Md and the first level cache memory 2, the number of bits in the data bus 10DB for connecting the two is increased, for example, to 128 so that high-speed data transfer is realized.

<DRAM Macro Structures>

Figure 2:
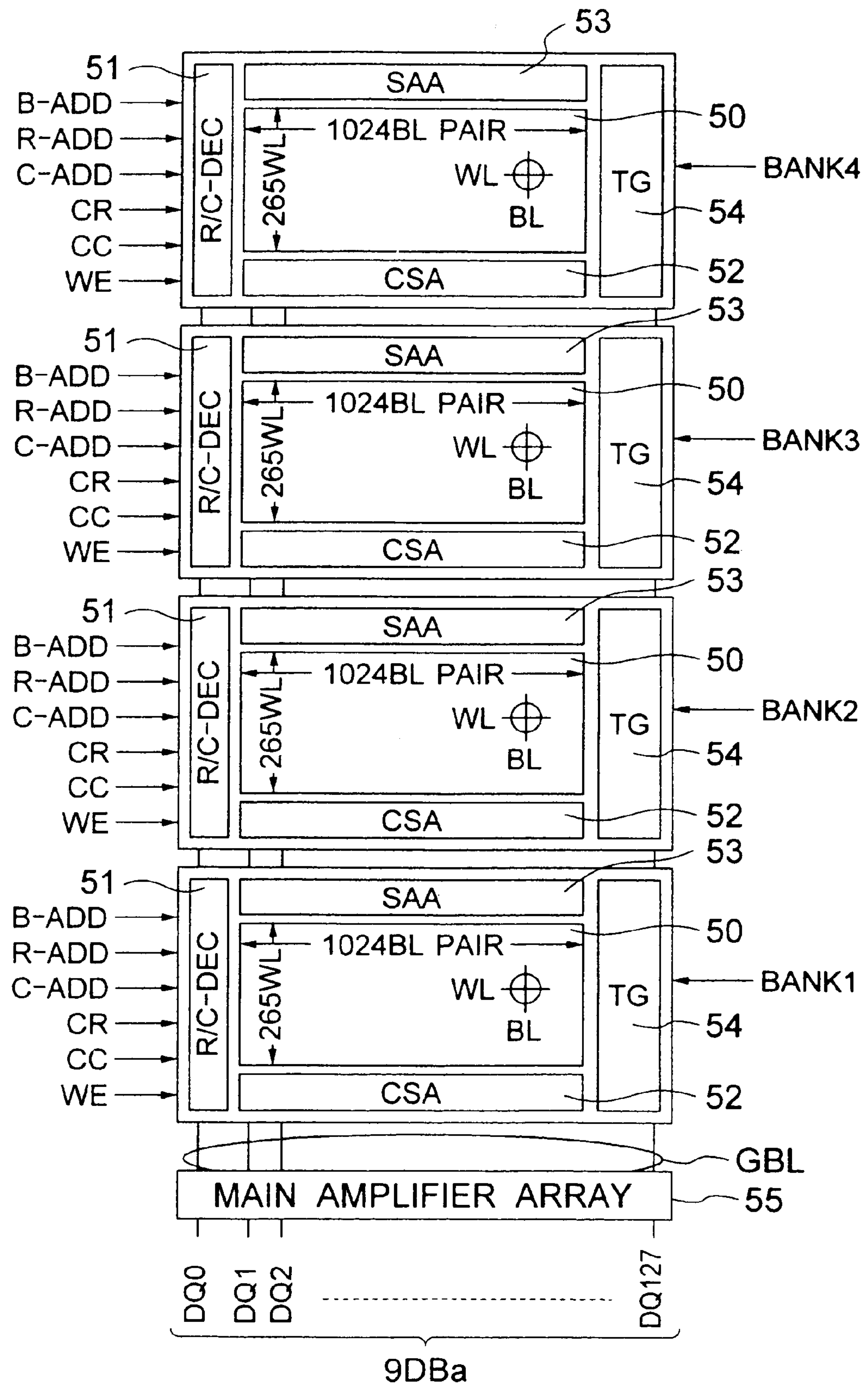
FIG. 2 is a block diagram showing an example of one of DRAM macro structures in FIG. 1.

FIG. 2 shows an example of one 5Ma of the DRAM macro structures. In FIG. 2, one DRAM macro structure 5Ma has, for example, 4 DRAM banks BANK1 to BANK4. Each of the DRAM banks BANK1 to BANK4 has a memory cell array 50, a row/column decoder 51, a column selector 52, a sense amplifier array 53, and a timing generator 54. The memory cell array 50 has a large number of dynamic memory cells arranged as a matrix. The selection terminal of each memory cell is connected to a word line WL. The data input/output terminal of each memory cell is connected to a local bit line BL. The local bit lines BL correspond to 1024 bits in total. Sense amplifiers are provided so as to correspond to the bits of the local bit lines BL. The sense amplifiers as a whole are generally called a sense amplifier array 53. The column switch circuit 52 selects the 128-bit local bit line BL from the 1024-bit local bit lines BL on the basis of a column address signal. The 128-bit local bit line selected by the column switch circuit 52 is connected to a 128-bit global bit line GBL. A word line selection signal and a selection signal for the column switch circuit are generated by the row/column decoder 51. The 128-bit global bit line GBL is connected to the data bus 9DBa through main amplifiers which are provided by bits. The main amplifiers are generally called a main amplifier array 55.

Each of the DRAM banks BANK1 to BANK4 is supplied with a bank selection signal B-ADD, a row address signal R-ADD, a column address signal C-ADD, a column command CC, a row command CR, a write-enable signal WE, etc. from the access optimizer 4 through the address/command bus 9ACB.

Although there is no specific limitation, the aforementioned signals are supplied through signal lines common to the DRAM banks BANK1 to BANK4. The bank selection signal B-ADD is a decode signal of a 2-bit bank address signal and a selection signal peculiar to each of the DRAM banks BANK1 to BANK4. Accordingly, one DRAM bank is selected on the basis of a 2-bit bank address signal. When one of the DRAM banks BANK1 to BANK4 is selected on the basis of a corresponding bank selection signal, the selected DRAM bank is enabled to operate. In the DRAM bank enabled to operate, the other input signals R-ADD, C-ADD, CC, RC, WE, etc. are made significant.

The timing generator 54 is enabled to accept the row command CR and the column command CC when one of the DRAM banks is selected on the basis of the bank selection signal B-ADD. The row command CR has the same function as an RAS (row address strobe) signal of a standard DRAM. When the row command CR is enabled, the row address signal R-ADD is fetched and decoded to perform the word line selecting operation. Data read, from memory cells in one word line to the bit line by the word line selecting operation are latched by sense amplifiers in the sense amplifier array 53. The column command CC has the same function as a CAS (column address strobe) signal of a standard DRAM. When the column command CC is enabled, the column address signal C-ADD is fetched and decoded so that the bit line selecting operation is performed by the column switch array 52. The 128-bit local bit line BL selected by the bit line selecting operation is connected to the global bit line GBL. Although there is no specific limitation, the timing generator 54 fetches the row address signal on the basis of the row command CR and, at the same time, fetches the write-enable signal WE to thereby determine an internal sequence for read and write operations.

When a column access operation is performed in a certain DRAM bank in the DRAM macro structure 5Ma, another DRAM bank can be selected to generate a row command to thereby perform a row access operation concurrently with the column access operation. Accordingly, when the column access to the certain DRAM bank is terminated, the other DRAM bank subjected to the row access concurrently with the column access to the certain DRAM bank can be subjected to the column access immediately. Accordingly, page-miss can be hidden apparently.

The other DRAM macro structures 5Mb to 5Md have the same configuration as the DRAM macro structure 5Ma.

FIG. 3 shows an example of configuration of connection between the DRAM bank and the global bit line. A pair of complementary bit lines BL<0,0> and BLB<0,0> are representatively shown in FIG. 3. In FIG. 3, the reference characters M1 and M2 designate column switch MOS transistors respectively; M3 and M4, precharge MOS transistors respectively; and M5, an equalize MOS transistor. A static latch-form circuit composed of MOS transistors M6 to M9 is a sense amplifier. A high potential side operating electric source ϕP such as a power-supply voltage is supplied to the common source of p-channel MOS transistors M7 and M9. A low potential side operating electric source ϕN such as a ground voltage of the circuit is supplied to the common source of n-channel MOS transistors M6 and M8. The memory cell is of a one-transistor type constituted by a series circuit composed of an n-channel selection MOS transistor M10 and a capacitor Cs. The word line WL is connected to the gate of the selection MOS transistor M10. HVC is a precharge potential which, for example, exhibits an intermediate voltage between the power-supply voltage and the ground voltage of the circuit. ϕPC is a precharge signal. When the level of the precharge signal is made high, not only the levels of the complementary bit lines are equalized to each other but also the precharge voltage HVP is supplied to the complementary bit lines.

Though not shown, the configuration of the other complementary bit lines is substantially the same as that of the complementary bit lines BL<0,0> and BLB<0,0>. Although there is no specific limitation, the column address signal is composed of 3 bits, and the column selection signal as a decode signal of the column address signal is composed of 8 bits Ys0 to Ys7. Eight pairs of complementary bit lines BL<0,0>, BLB<0,0> to BL<0,7>, BLB<0,7> are connected to a pair of global bit lines GBL0 and GBLB0 through 8 pairs of column switch MOS transistors M1 and M2 switching-controlled on the basis of the column selection signal Ys0 to Ys7. In this manner, 1024 (128×8) complementary bit lines BL<0,0>, BLB<0,0> to BL<127,7>, BLB<127,7> in total are connected to 128 pairs of global bit lines GBL0, GBLB0 to GBL127, GBLB127 successively in 8 pairs. Accordingly, the level of one of the column selection signal Ys0 to Ys7 is switched to be high as a selection level in accordance with a result of decoding of the column address signal C-ADD. As a result, 128 pairs of complementary bit lines are connected to 128 pairs of global bit lines GBL0, GBLB0 to GBL127, GBLB127.

<Access Optimizer>

Figure 4:
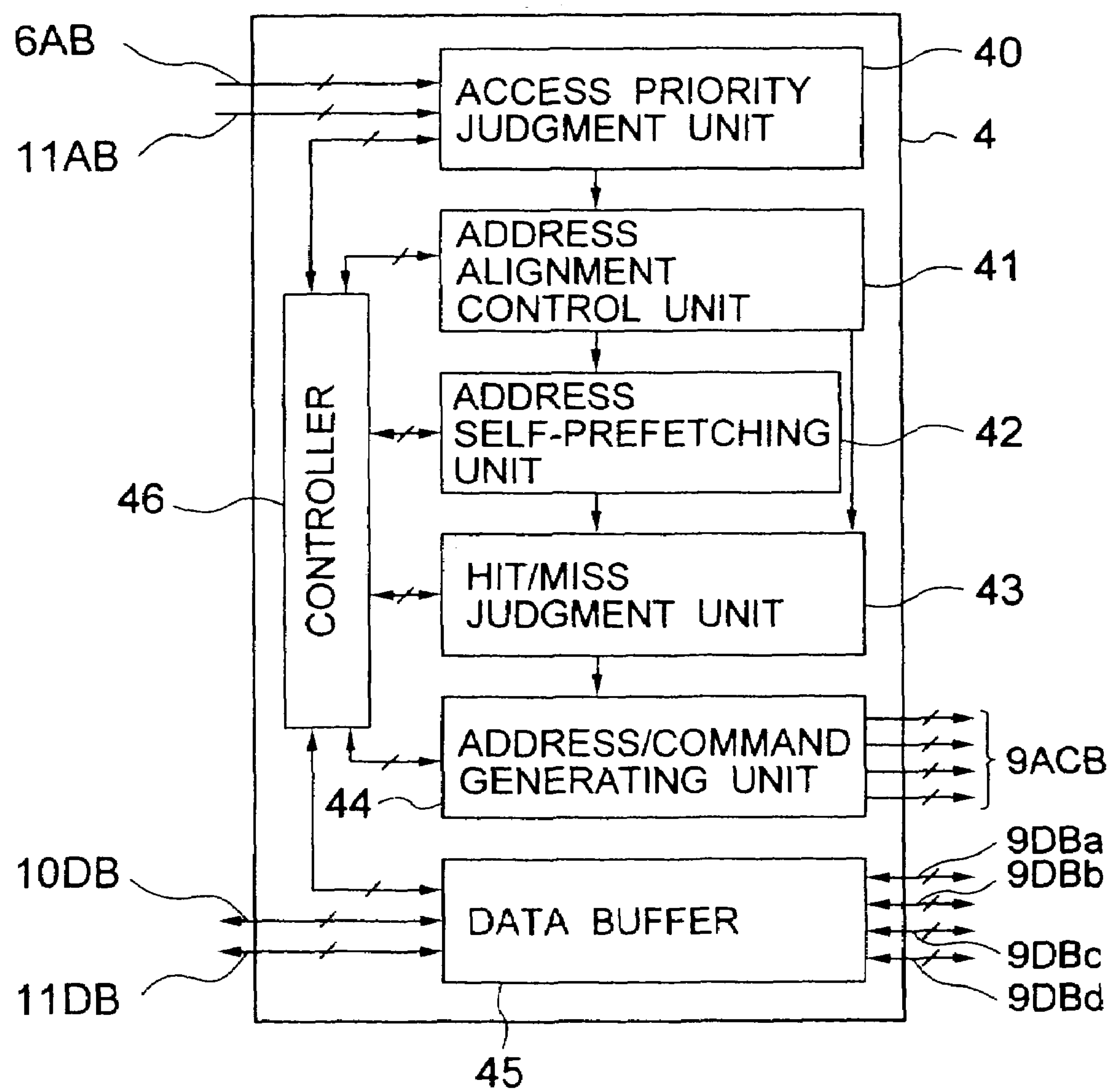
FIG. 4 is a block diagram showing an example of an access optimizer.

FIG. 4 shows an example of the access optimizer. The access optimizer 4 has an access priority judgment unit 40, an address alignment control unit 41, an address self-prefetching unit 42, a hit/miss judgment unit 43, an address/command generating unit 44, a data buffer circuit 45, and a controller 46.

The data buffer circuit 45 has selectors for selecting one of the data buses 9DBa to 9DBd to connect the data bus 10DB with the data buffer to the selected data bus and for selecting one of the data buses 9DBa to 9DBd to connect the data bus 11DB with the data buffer to the selected data bus, respectively.

The access priority judgment unit 40 permits parallel access through the first and second access ports PT1 and PT2 when access through the first access port PT1 and access through the second access port PT2 use different DRAM macro structures. When access through the first access port PT1 and access through the second access port PT2 use one and the same DRAM macro structure, the access priority judgment unit 40 performs control so that high-priority one of the access ports determined in advance is operated preferentially.

The address/command generating unit 44 is a circuit for operating for every DRAM bank to generate a command/address signal to the address command bus 9ACB. That is, the address/command generating unit 44 generates the bank selection signal B-ADD, the row address signal R-ADD, the column address signal C-ADD, the row command CR, the column command CC, the write-enable signal WE, etc.

The address alignment control unit 41 is a circuit for changing the bit alignment of the access address signal supplied from the outside of the access optimizer 4 and subjected to the access priority judgment to thereby make it possible to supply the signal to the DRAM macro structures 5Ma to 5Md through the address/command generating unit 44.

The address/command self-prefetching unit 42 is a circuit for self-prefetching an access address having a predetermined offset to an external access address after DRAM macro access control with respect to the external access address so that data in the self-prefetched address can be preread from the memory cells of the DRAM macro structures to the sense amplifiers through the address/command generating unit 44.

The hit/miss judgment unit 43 is a circuit for judging whether an access request is hit to data already latched by the sense amplifier array 53 or not. In other words, this is a hit/miss judgment means for achieving a sense amplifier cache. This means holds the previous access address and judges whether the previous access address and the current access address are in one and the same word line or whether the self-prefetched address and the current access address are in one and the same word line. A result of the judgment that the two addresses are in one and the same word line indicates a hit state of the sense amplifier cache. In this case, the hit/miss judgment unit 43 makes the address/command generating unit 44 prevent generation of the row command CR while making the same generate the column command CC immediately so that data already latched by the sense amplifier array can be read out. The controller 46 controls the access optimizer 4 as a whole.

The access optimizer 4 achieves (1) enhancement of the hit ratio of the sense amplifier cache by next address self-prefetching, (2) preventing the lowering of the operating efficiency of the multi-bank DRAM when cache entry replacement is performed because of cache-miss of the set associative type first level cache memory, and (3) making non-blocking multi-access possible so that one access does not block another access in a plurality of access requests without conflict between the access request from the CPU to the DRAM macro structures and the access request from the outside to the DRAM macro structures. Further, the DRAM banks BANK1 to BANK4 perform write without data read-out to thereby enhance the efficiency of rewriting of data with respect to the DRAM macro structure using the sense amplifier cache with the memory cell group in every word line as a cache line. The contents of (1) to (4) will be described below in detail.

<Enhancement of the Hit Ratio of the Sense Amplifier Cache by Next Address Self-Prefetching>

Figure 5:
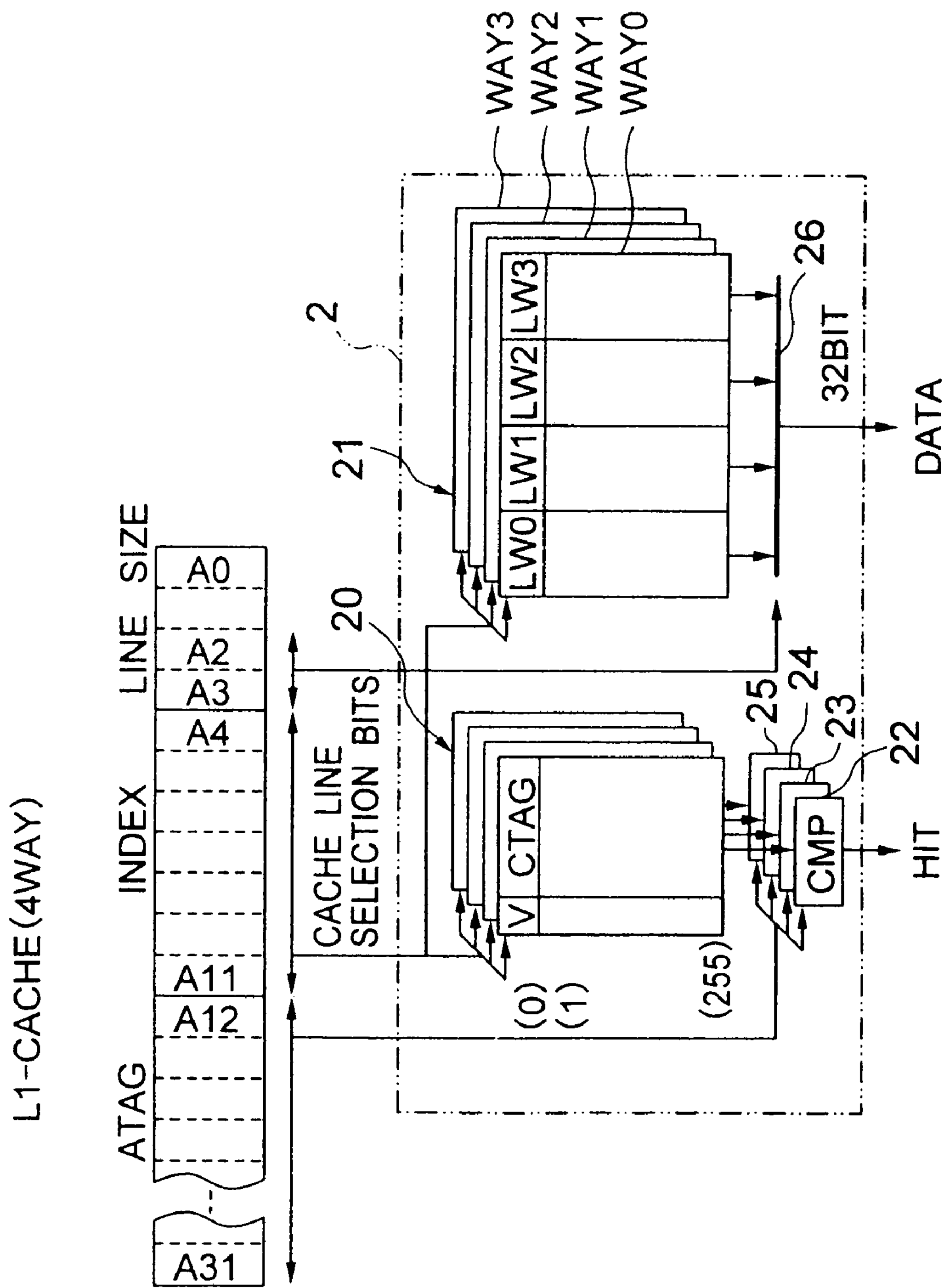
FIG. 5 is a block diagram showing an example of basic configuration of a first level cache memory.

FIG. 5 shows an example of basic configuration of the first level cache memory 2. Though not limited specifically, the first level cache memory 2 is of a set associative type and has 4 ways WAY0 to WAY3. Though not limited specifically, each of the ways WAY0 to WAY3 has a memory cell array for forming 256 cache lines at maximum. The memory cell array is constituted by an address array 20 and a data array 21. One cache line contains a cache tag CTAG holding an address tag ATAG such as physical page number, or the like, a validity bit V, a not-shown dirty bit, and corresponding 16-byte data LW0 to LW3. The cache tag CTAG, the validity bit V and the dirty bit are stored in the address array 20. The data LW0 to LW3 are stored in the data array 21. The validity bit V expresses whether effective data are contained in the cache line or not. The logical value "1" of the validity bit V means validness, while the logical value "0" of the validity bit V means invalidness. The dirty bit is used when the cache memory 2 is used in a write back mode. When write occurs in the write back mode, the dirty bit takes the logical value "1". Anticoincidence between data in a corresponding entry and data in the external memory (5Ma to 5Md) can be found by the dirty bit. The dirty bit is initialized to the logical value "0" by power-on resetting.

The address signal output from the CPU 1 (If the CPU 1 supports virtual addresses, the address signal is a physical address signal. If not, the address signal is a logical address signal.) has 32 bits A0 to A31 as described above. The 32 bits A0 to A31 are used as byte addresses. Though not limited specifically, the bits A21 to A31 are regarded as an address tag ATAG. The 8 bits A4 to All are regarded as an index address INDEX for selecting a cache line from each way. Although address decoders for the address array 20 and the data array 21 are not shown in FIG. 5, the index address INDEX is supplied to the address decoders so that a corresponding cache line is selected.

The cache tag CTAG in the cache line (in each of the ways WAY0 to WAY3) selected on the basis of the index address INDEX is compared with the address tag ATAG in the access address by each of the comparators 22 to 25. When the cache tag CTAG coincides with the address tag ATAG such as a physical page number so that the validity bit V takes the logical value "1", the output signal from a corresponding one of the comparators 22 to 25 takes the logical value "1". The output signal from the corresponding one of the comparators 22 to 25 is supplied to a corresponding data array 21. When the signal takes the logical value "1", 32-byte cache line data indexed by the data array 21 are selected. The selected cache line data are selected by the selector 26 on the basis of 2 bits A2 and A3. Logical ORing of the signals output from the comparators 22 to 25 is used as a hit/miss signal HIT of the cache memory 2.

Figure 6:
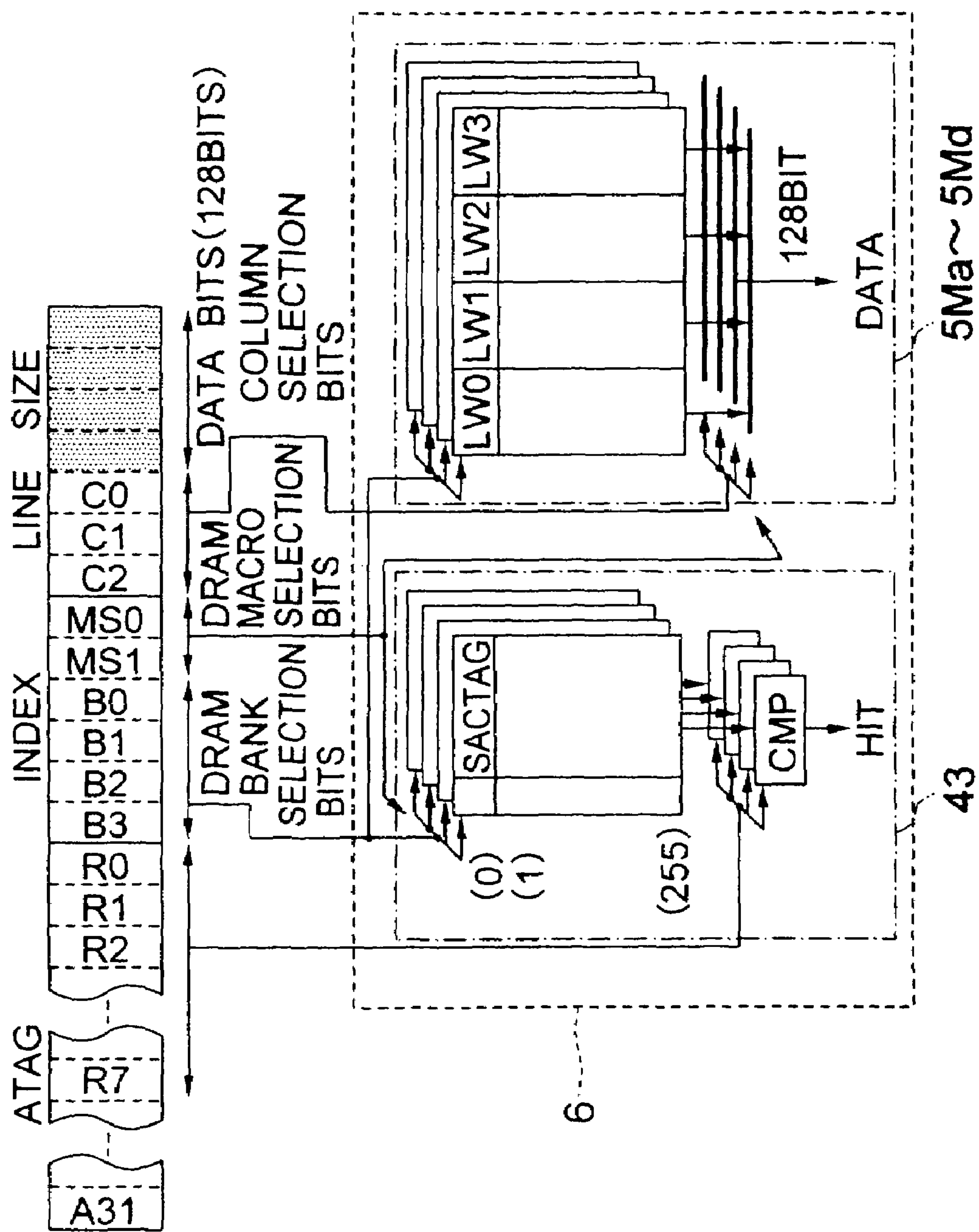
FIG. 6 is a block diagram showing the logical configuration of a sense amplifier cache function using a plurality of DRAM macro structures so as to be able to compare with the first level cache memory.

FIG. 6 shows the logical configuration of the sense amplifier cache function of the four DRAM macro structures 5Ma to 5Md in comparison with the first level cache memory 2. The least significant 4 bits in the address signal supplied to the DRAM macro structures 5Ma to 5Md are substantially meaningless. This is because data to be column-selected contain 128 bits and it is a data size of 4 bits as byte address. Three bits C0 to C2 are used as a column selection signal C-ADD. Two bits MS0 and MS1 on the high order side are used as a macro address signal for selecting one of the DRAM macro structures 5Ma to 5Md. Four bits B0 to B3 on the further high order side are used as a bank address signal for selecting one of the DRAM banks. Assume now that there are 16 DRAM banks. Eight bits R0 to R7 on the further high order side are used as a row address signal R-ADD. It is a matter of course that the address comparison in the sense amplifier cache is different from that in the set associative cache memory. The previous access address by every DRAM bank is held in the hit/miss judgment unit 43. A row address in the previous access address held in the aforementioned manner is shown as SACTAG in FIG. 6. The hit/miss judgment unit 43 compares a row address signal in the current access address with the row address SACTAG in the previous access address. When the row addresses coincide with each other, a hit state is given so that data already latched by the sense amplifier are selected on the basis of the column address signal by the address/command generating unit 44.

As is obvious from the above description, the speed of first access to the DRAM macro structures can be enhanced in the case where data are held in each of the sense amplifiers of the DRAM bank by use of multi-bank DRAM macro structures 5Ma to 5Md so that data latched by the sense amplifier are output when access hits the held data. That is, each of the memory banks can be made to function as a sense amplifier cache.

To improve the hit ratio (the hit ratio to data in the sense amplifier) of the sense amplifier cache more greatly, the next address (obtained by addition of a predetermined offset) is self-prefetched by the address self-prefetching unit 42 after the external access, so that data in the self-prefetched address are preread by the sense amplifier in another memory bank. The reason why a subject of self-prefetching is the next address is based on an empirical rule that operating programs of the CPU 1 or a group of processing data are basically mapped on linear addresses. This is for the purpose of facilitating cache-hit of the sense amplifier cache with respect to the aforementioned access.

The self-prefetching address must be an address in a memory bank different from the subject of previous access. If the two addresses are in one and the same memory bank, the function of the sense amplifier cache cannot be used for the previous access. Therefore, the access address having a predetermined offset to the external access address is set as an address for designating a memory bank different from that designated by the external access address.

At least a part from the least significant bit to MS1 in the bit alignment of the address signal of FIG. 6 supplied to the DRAM macro structures 5Ma to 5Md is made identical with that in the address signal output from the CPU 1. Accordingly, in the case where the address signal output from the CPU 1 is incremented successively, the DRAM macro structure is changed to a new one whenever the word line selection state is switched. Accordingly, the predetermined offset given by the address self-prefetching unit 42 is made 2 to the power i (2^3=8) from the least significant bit of the column address signal when i (=3) is the number of bits in the column address signal.

Figure 7:
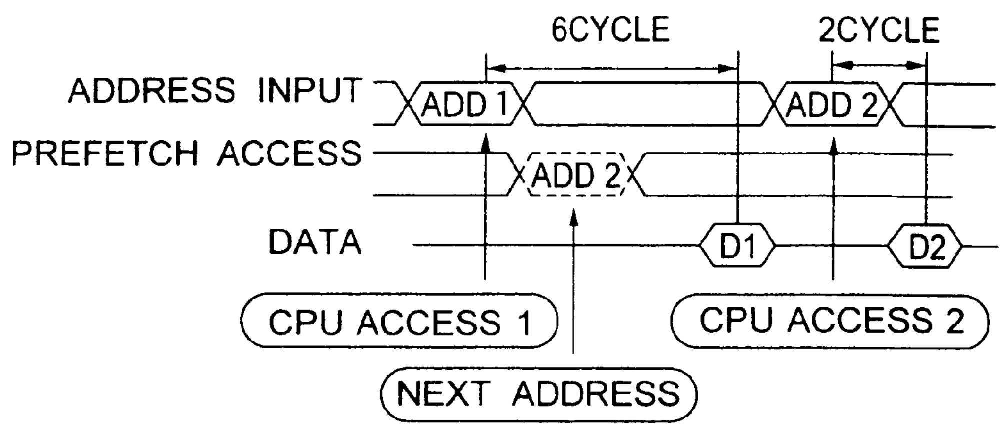
FIG. 7 is a timing chart showing an example of an address self-prefetching operation.

FIG. 7 shows an example of the timing chart of the address self-prefetching operation. Assume that the access address by the CPU 1 is ADD1. Assume that a new word line selecting operation is carried out on the other hand. For example, after 6 cycles from the access, data D1 corresponding to the access address ADD1 is read out. In the period of 6 cycles, the address self-prefetching unit 42 adds 8 to the address ADD1 to generate an address ADD2 in its inside, instructs the address/command generating unit 44 to perform a row operation, instructs a DRAM bank of a DRAM macro structure corresponding to the self-prefetched address signal to perform a word line selecting operation and makes the sense amplifier latch data in the selected word line. If 8 is added to the access address signal as described above, the resulting access address ADD2 always shift to another DRAM macro structure. Accordingly, the operation of the memory bank based on the access address ADD1 is not disturbed. Accordingly, if the next access address by the CPU 1 is ADD2, the address/command generating unit 44 selects latch information of the sense amplifier directly on the basis of the column address signal contained in the address ADD2 without the word line selecting operation based on the address ADD2 to thereby output data D2 to the outside.

Figure 8:
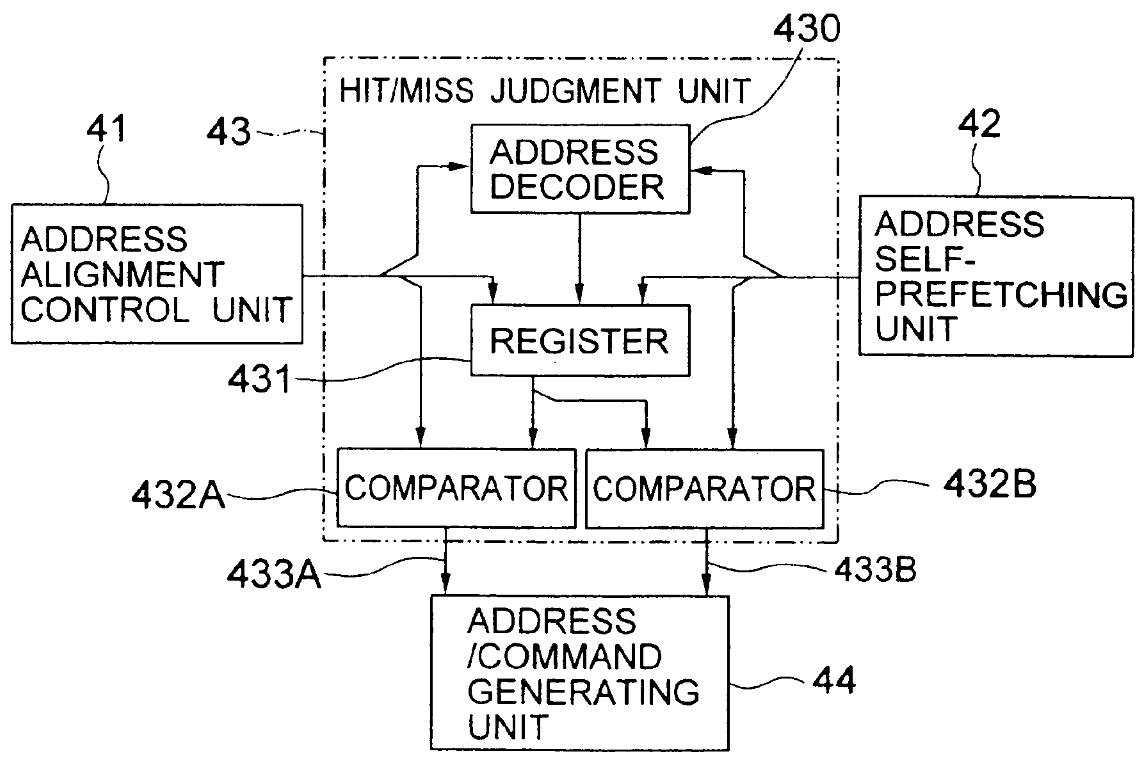
FIG. 8 is a block diagram showing an example of a hit/miss judgment unit when address self-prefetching is taken into account.

FIG. 8 shows an example of the hit/miss judgment unit 43 in the case where the aforementioned address self-prefetching is taken into account. The hit/miss judgment unit 43 has an address decoder 430, a register 431, and comparators 432A and 432B. The register 431 has address storage regions peculiar to DRAM banks, respectively, of the DRAM macro structures 5Ma to 5Md. The previous access address signal in a corresponding memory bank is held in the address storage region. The address decoder 430 receives an address signal from the address alignment control unit 41 and an address signal from the address self-prefetching unit 42 and decodes a 2-bit macro address signal and a 4-bit bank address signal contained in the input address signals respectively. An address storage region corresponding to the DRAM bank of the DRAM macro structure to be subjected to access is selected by use of the decode signals. In the selected address storage region, address information already held is first output and then updated to current access address information. When the address information already held is output, the comparator 432A compares the address signal given from the register 431 with the address signal given from the address alignment control unit 41 and the comparator 432B compares the address signal given from the register 431 with the address signal given from the address self-prefetching unit 42. If the comparison results in coincidence in higher order address information than the column address signal, sense amplifier cache hit signals 433A and 433B are enabled and given to the address/command generating unit 44.

The address/command generating unit 44 makes a judgment by the state of the sense amplifier cache hit signals 433A and 433B as to whether a row command CR is generated to the access address at this point of time or not. That is, the address/command generating unit 44 instructs the DRAM macro structure designated by the access address to perform an operation of selecting the memory bank, the word line and the bit line in response to detection of anticoincidence based on the signals 433A and 433B and instructs the DRAM macro structure designated by the access address to stop the word line selecting operation and perform an operation of selecting the memory bank and the bit line in response to detection of coincidence based on the signals 433A and 433B.

<Address Alignment Control for Second Level Cache>

Figure 9:
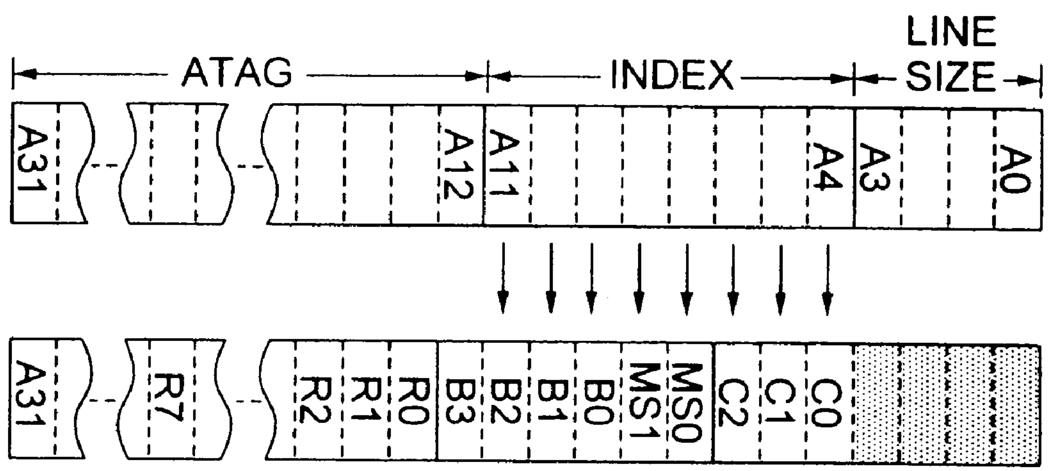
FIG. 9 is an explanatory view showing an example of the correlation between an output address signal supplied from the CPU to the first level cache memory without address alignment of an address alignment control unit and an output address signal supplied from the access optimizer to the DRAM macro structures.

FIG. 9 shows correlation between an address signal (an output address signal of the CPU 1) supplied to the first level cache memory 2 and an address signal (an output address signal of the access optimizer) supplied to the DRAM macro structures 5Ma to 5Md in the condition that address alignment control is not performed by the address alignment control unit 41.

The access optimizer 4 and the DRAM macro structures 5Ma to 5Md can be located as a second level cache memory 6 by the sense amplifier cache function thereof.

When cache read-miss occurs in the first level cache memory 2, there is some case where both replacement of the cache line and write back of data in the cache line must be performed. In this case, the index address information portion of the write back destination address and the index address information portion of the read address of cache data to be replaced are equalized to each other. This is obvious from the index operation in a set associative type cache memory. The two addresses are different from each other in the address tag portion.

As is obvious from the address alignment in FIG. 9, in this occasion, CPU addresses having equal index addresses INDEX are identical in address bits A4 to All. Except the most significant bit B3 of the bank address signal, column address signal bits C0 to C2, macro address signal bits MS0 and MS1 and part B0 to B2 of the bank selection signal are allocated to the address bits A4 to A11 respectively. If the most significant bit A12 of address tag information ATAG for the write back destination address and the most significant bit A12 of address tag information ATAG for the read address of cache data to be replaced coincide with each other, write access to DRAM macro structures for write back and read access from DRAM macro structures for replacement are performed on one and the same DRAM bank in one and the same DRAM macro structure. The probability of coincidence in one bit A12 is relatively high. If such a condition occurs, two access operations cannot be performed efficiently by use of different memory banks in the DRAM macro structures. If one access operation does not terminate in one DRAM bank, the other access operation cannot be performed. If different DRAM banks to be operated are used, a read operation is performed in one DRAM bank and at the same time at least a row command CR can be supplied to the other DRAM bank to perform a word line selecting operation concurrently.

Therefore, the address alignment control unit 41 is provided. The address alignment control unit 41 changes the bit alignment of the access address signal supplied from the outside so that the changed signal can be supplied to the DRAM macro structures 5Ma to 5Md.

Figure 10:
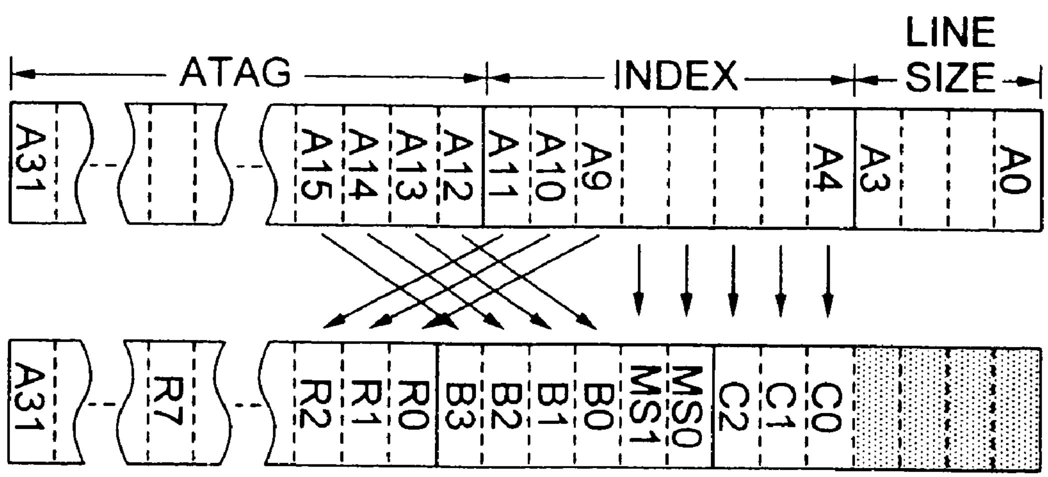
FIG. 10 is an explanatory view showing a first example of correlation between an output address signal of the CPU obtained by address alignment of the address alignment control unit and an output address signal of the access optimizer.
Figure 11:
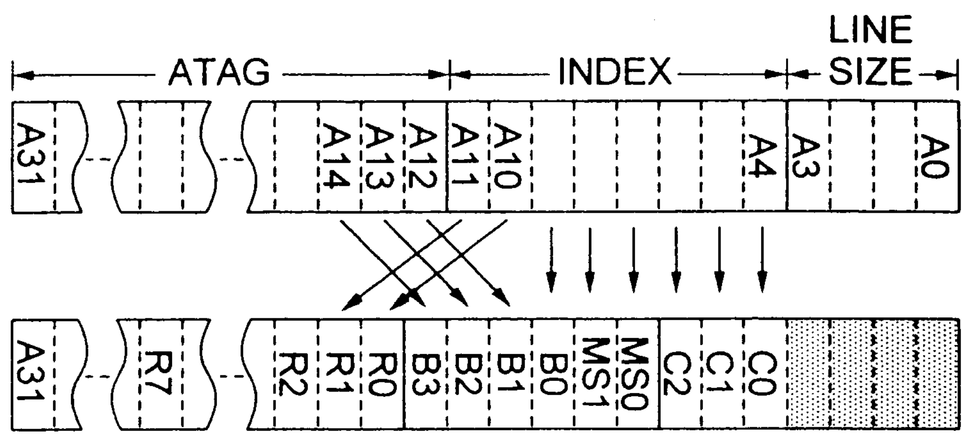
FIG. 11 is an explanatory view showing a second example of correlation between an output address signal of the CPU obtained by address alignment of the address alignment control unit and an output address signal of the access optimizer.

FIG. 10 shows a first example of correlation between an output address signal of the CPU 1 obtained by address alignment of the address alignment control unit 41 and an output address signal of the optimizer 4. In the example shown in FIG. 10, address bits A12 to A15 are made bits B0 to B3 of the bank address signal and address bits A9 to A11 are made part R0 to R2 of the row address signal. The other alignment is the same as in FIG. 9. FIG. 11 shows a second example of address alignment. In the example shown in FIG. 11, address bits A12 to A14 are made part B1 to B3 of the bank address signal and address bits A10 and A11 are made part R0 and R1 of the row address signal. The other alignment is the same as in FIG. 9. In each of FIGS. 10 and 11, a part of address information contained in the address signal supplied from the CPU 1 and used as an index address INDEX of the first level cache memory 2 and a part of address information contained in the address signal supplied from the CPU 1 and used as a tag address ATAG are replaced with each other so as to be allocated to the bank address of the memory bank.

Accordingly, when both replacement and write back of the cache entry are to be performed because of cache-miss of the first level cache memory 2, the two memory operations can be performed in different DRAM banks respectively. With respect to different DRAM banks contained in one DRAM macro structure, when a column operation is performed in one DRAM bank, a row command CR can be supplied to the other DRAM bank concurrently with the column operation in one DRAM bank so that a word line selecting and sense amplifier latching operation is performed precedently. Accordingly, when a column access operation is performed and a write operation for write back is performed in one DRAM bank, a row command CR can be supplied to the other DRAM bank so that a word line selecting and sense amplifier latching operation in a read operation for replacement is performed precedently. Accordingly, after the write operation for write back, the column selecting and output operation in the read operation for replacement can be performed immediately. Accordingly, the speed of a penalty operation caused by cache-miss of the first level cache memory 2 can be enhanced.

Figure 12:
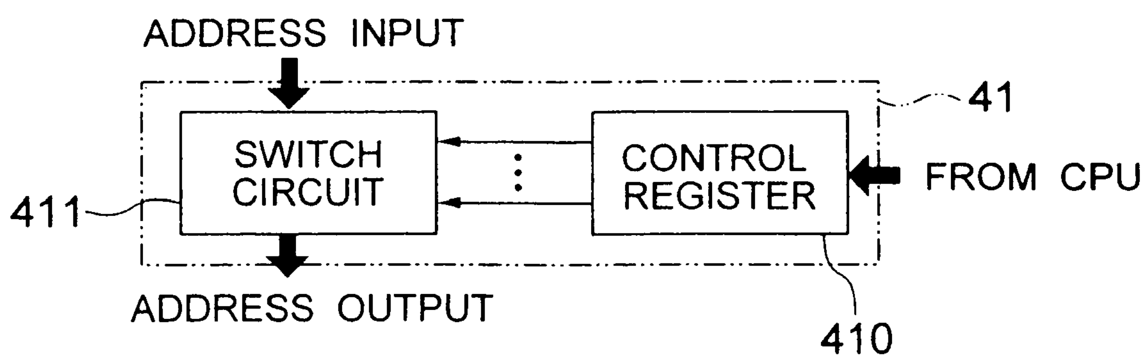
FIG. 12 is a block diagram showing an example of the address alignment control unit.

FIG. 12 shows an example of the address alignment control unit 41. The address alignment control unit 41 has a switch circuit 411 for changing the alignment of an input address signal to output the changed alignment, and a control register 410 for latching control information for determining the switching state of the switch circuit 411. The control register 410 is formed so as to be able to be accessed by the CPU 1. Accordingly, one of the address alignments shown in FIGS. 10 and 11 can be selected optionally.

Figure 13:
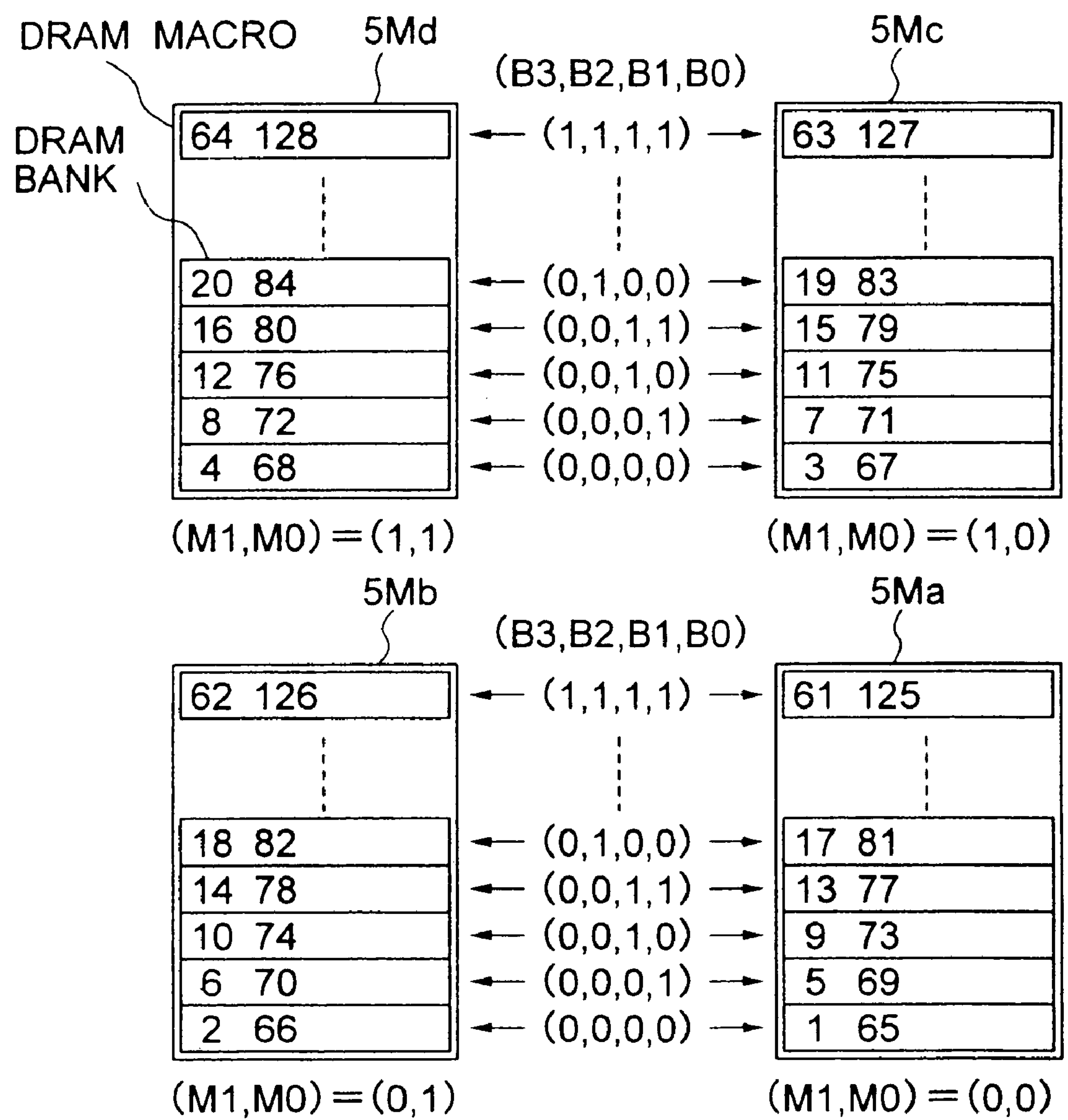
FIG. 13 is an explanatory view showing a sequence of DRAM banks subjected to the word line selecting operation in the case where address spaces of the CPU are accessed sequentially when address alignment control is not performed as shown in FIG. 9.
Figure 14:
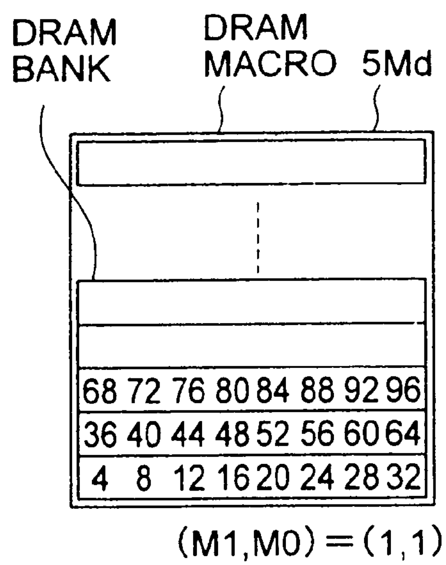
FIG. 14 is an explanatory view showing a sequence of DRAM banks subjected to the word line selecting operation in the case where address spaces of the CPU are accessed sequentially when address alignment control is performed as shown in FIG. 10.
Figure 14:
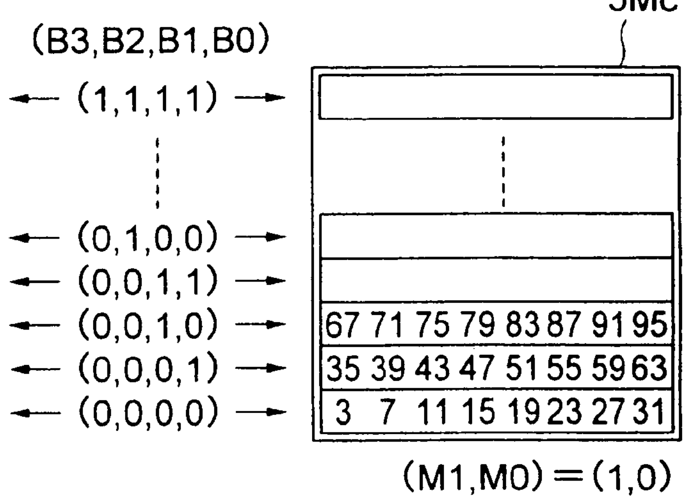
Figure 14:
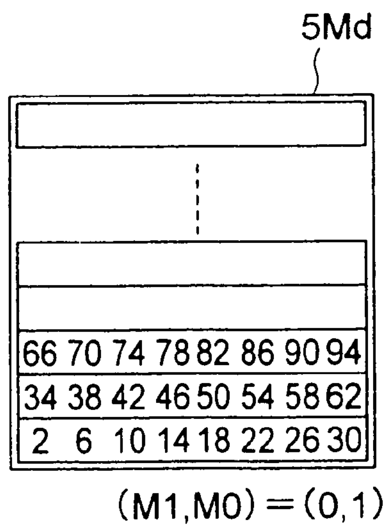
Figure 14:
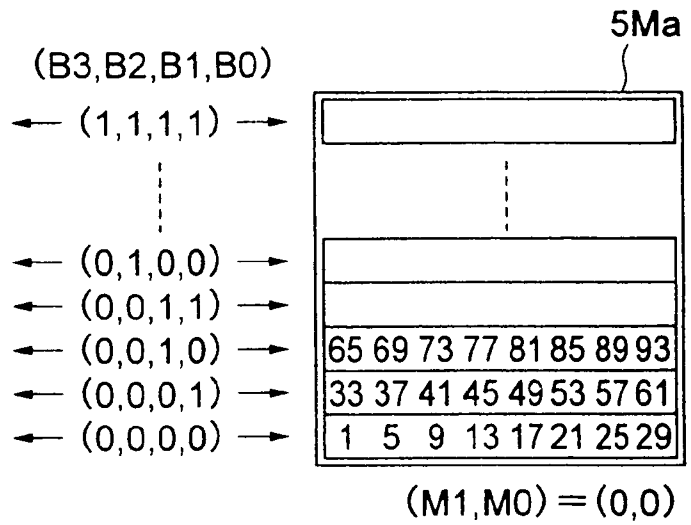
Figure 15:
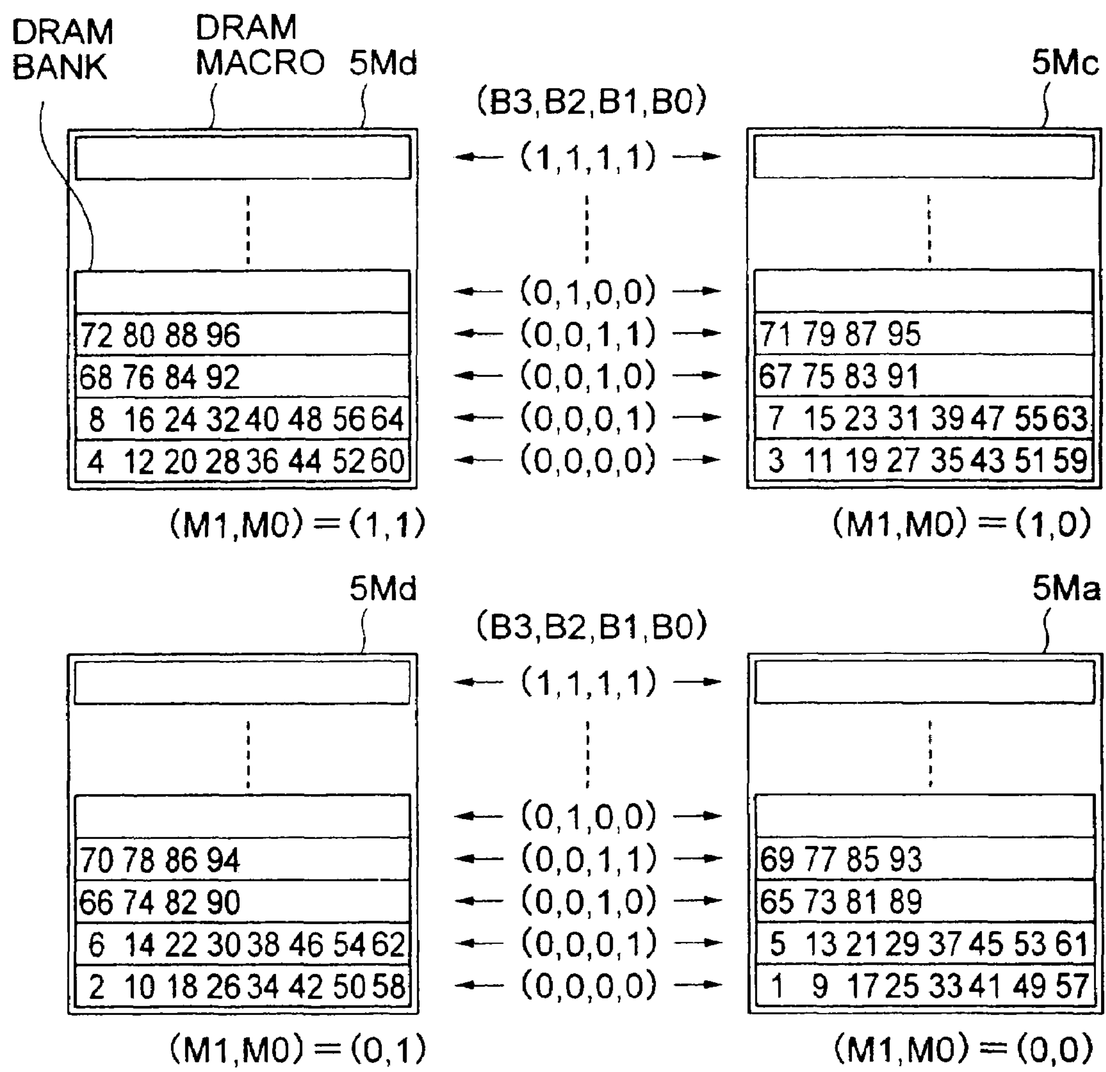
FIG. 15 is an explanatory view showing a sequence of DRAM banks subjected to the word line selecting operation in the case where address spaces of the CPU are accessed sequentially when address alignment control is performed as shown in FIG. 11.

The difference between the address alignments appears as the difference in frequency of designation of one and the same memory bank for continuous addresses. FIGS. 13 to 15 show sequences of DRAM banks subjected to the word line selecting operation when the address spaces of the CPU 1 are accessed successively. Each of the four DRAM macro structures 5Ma to 5Md has 16 DRAM banks. In the case of FIG. 13 corresponding to FIG. 9 without address alignment control, all the 64 DRAM banks are switched successively and the selection of the word line is switched successively (the case of continuous 64 banks). In the case of FIG. 14 corresponding to FIG. 10 showing a first example of address alignment control, the selection of the word line is switched while 4 DRAM banks are switched cyclically (the case of continuous 4 banks). In the case of FIG. 15 corresponding to FIG. 11 showing a second example of address alignment control, the selection of the word line is switched while 8 DRAM banks are switched cyclically (the case of continuous 8 banks).

If the frequency in selection of one and the same memory bank in index addresses close to each other in replacement of a cache line is high, the hit ratio by the sense amplifier cache function decreases as information access addresses are closer to each other. If the frequency in selection of different memory banks in index addresses close to each other in replacement of a cache line is high, the hit ratio by the sense amplifier cache function increases as information access addresses are closer to each other. Which is selected more advantageously depends on address mapping of data and commands. Selection can be made in accordance with an application system.

Wiring in which address alignment is fixed by metal option can be used as the address alignment control unit 41. The selection of address alignment cannot be made in any stage but a stage of production process or planning. The circuit configuration for address alignment control can be, however, simplified.

<Parallel Access to Non-Conflicting DRAM Macro Structures>

Figure 16:
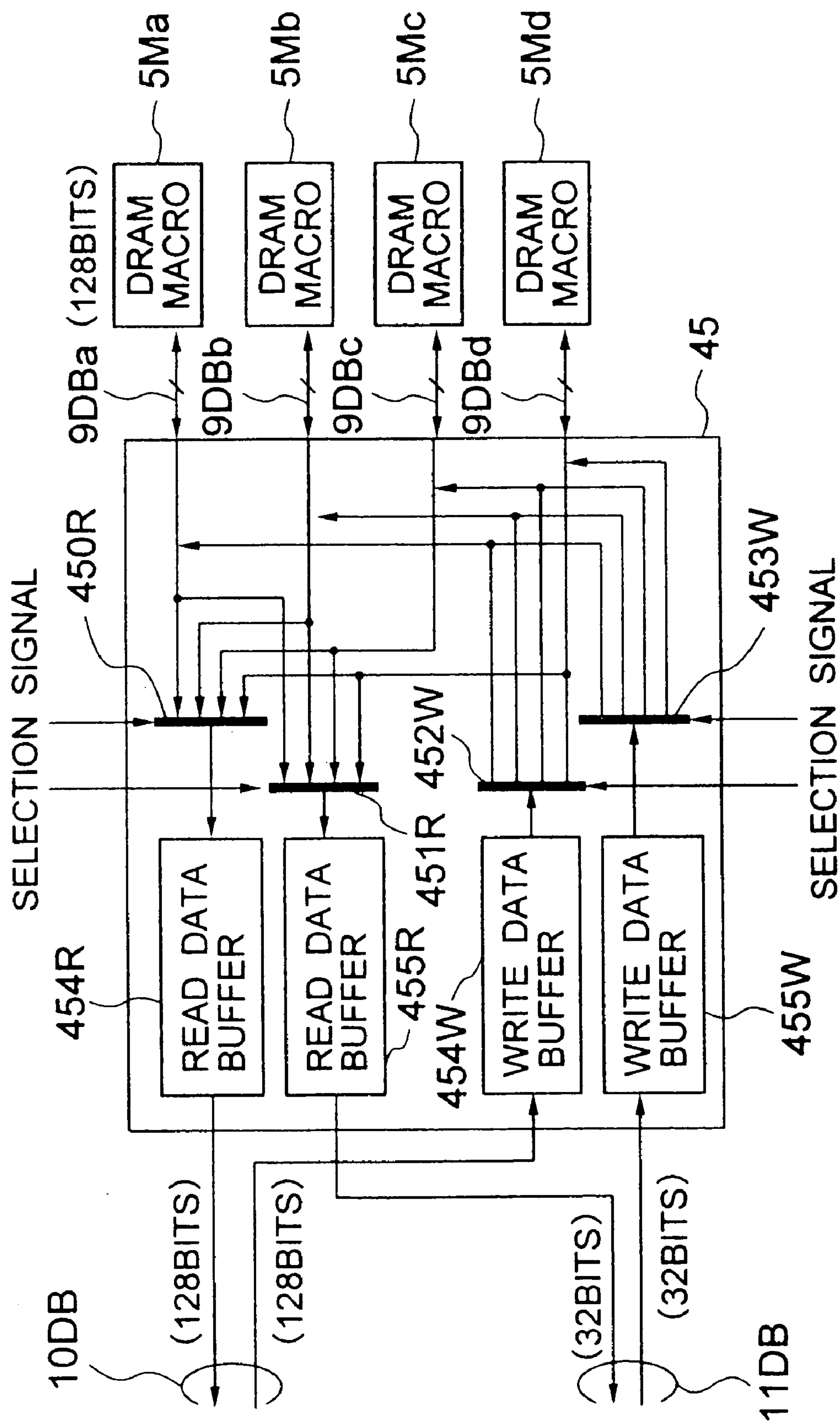
FIG. 16 is a block diagram showing an example of a data buffer circuit.

FIG. 16 shows an example of the data buffer circuit 45. The data buffer circuit 45 has a combination of a read data buffer 454R and a write data buffer 454W connected to the data bus 10DB of the first port PT1, a combination of a read data buffer 455R and a write data buffer 455W connected to the data bus 11DB of the second port PT2, and selectors 450R, 451R, 452W and 453W. The selector 450R selects one of the DRAM macro structures 5Ma to 5Md and connects the selected DRAM macro structure to the read data buffer 454R. The selector 451R selects one of the DRAM macro structures 5Ma to 5Md and connects the selected DRAM macro structure to the read data buffer 455R. The selector 452W selects one of the DRAM macro structures 5Ma to 5Md and connects the selected DRAM macro structure to the write data buffer 454W. The selector 453W selects one of the DRAM macro structures 5Ma to 5Md and connects the selected DRAM macro structure to the write data buffer 455W. The selection signals of the selectors 450R, 451R, 452W and 453W are output from the controller 46.

Each of the output of the read data buffer 454R and the input of the write data buffer 454W is composed of 128 bits. On the other hand, each of the read data buffer 455R and the write data buffer 455W includes a data aligner, so that the bus 11DB side interface is of a 32-bit type whereas the selector 451R/453W side interface is of a 128-bit type.

When access through the first access port PT1 and access through the second access port PT2 use different DRAM macro structures respectively, the access priority judgment unit 40 permits parallel access through the two access ports.

Such non-conflicting access to DRAM macro structures is judged on the basis of comparison between a macro address signal contained in an address signal supplied from the bus 6AB and a macro address signal contained in an address signal supplied from the bus 11AB. A result of the judgment is given to the controller 46, so that the controller 46 performs selection control of the selectors 450R, 451R, 452W and 453W on the basis of the macro address signals supplied from the two buses.

When access through the first access port PT1 and access through the second access port PT2 use one and the same DRAM macro structure, the access priority judgment unit 40 gives priority to the operation of higher-priority access port determined in advance.

Figure 17:
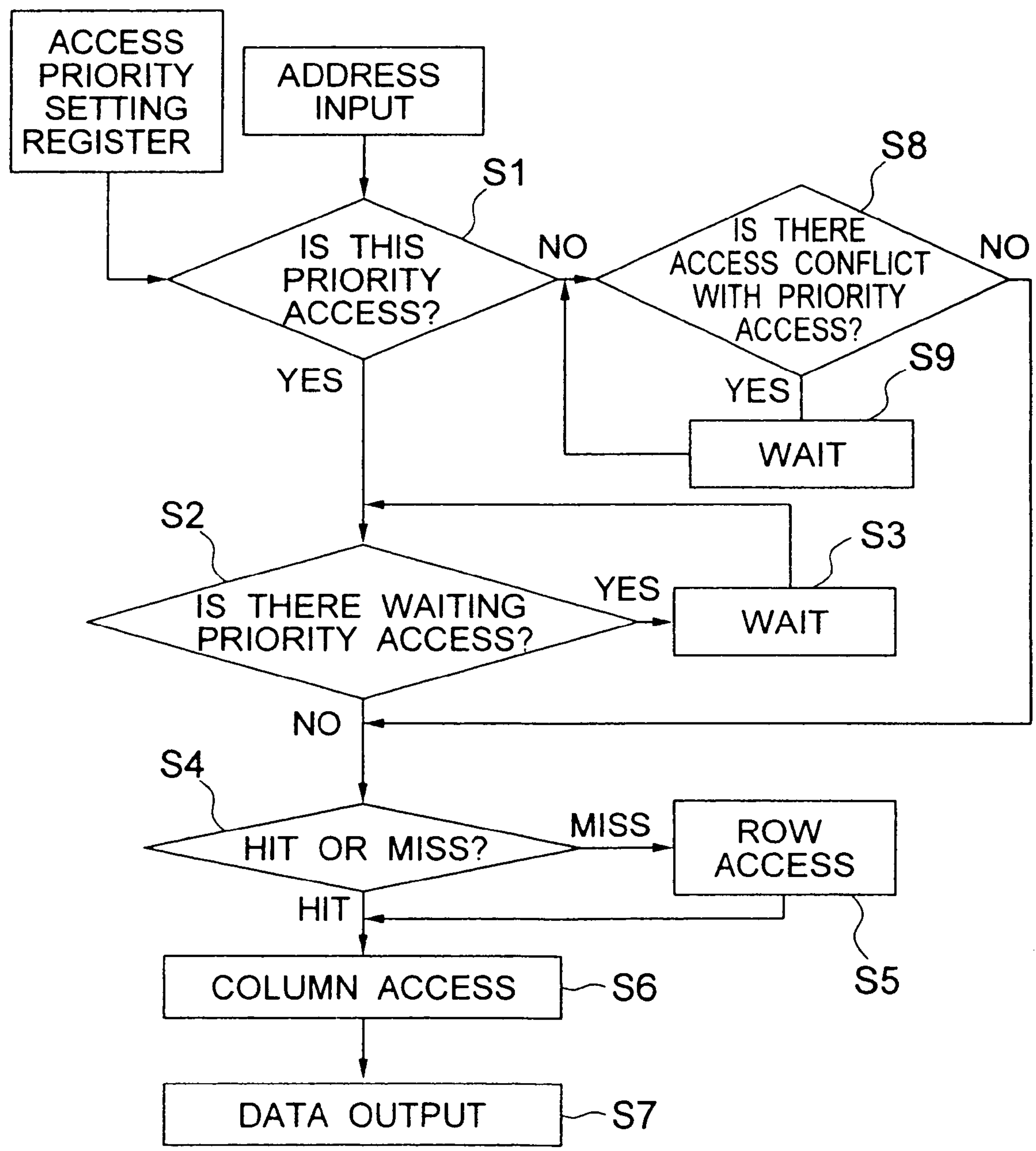
FIG. 17 is a flow chart showing an example of a procedure for access priority judgment and for controlling an access operation based on the access priority judgment in the case where access conflict occurs in one and the same DRAM macro structure.

FIG. 17 shows an example of a procedure for access priority judgment and access control using the access priority judgment in the case where access conflict occurs in use of one and the same DRAM macro structure.

An access priority port is designated by an access priority setting register. With respect to an address input, a judgment is made as to whether the input source is the priority port or not (S1). If access is through the priority port, a judgment is made as to whether there is any waiting priority access or not (S2). Waiting is made until the priority access terminates (S3). Then, the hit/miss judgment unit 43 makes a hit/miss judgment of the sense amplifier cache (S4). If there is cache-miss, word line selection as a row address operation and row access for latching the sense amplifier are performed (S5). Then, column access such as a column selecting operation, or the like, is performed (S6). Thus, data are output (S7). If cache-miss is detected in the step S4, the situation of the procedure skips over the row access step (S5) to the column access step (S6) and the data output step (S7). If there is no priority access in the step S1, a judgment is made as to whether there is access conflict with priority access or not (S8). If there is access conflict, waiting is made until priority access concerning the conflict terminates (S9). Then, the situation of the procedure goes to the step S4.

FIGS. 18A to 18D show some examples of operation timing of DRAM macro structures on the basis of the result of the access priority judgment. Assume now the condition that address signals aA0 and aA1 are supplied from the CPU 1 through the bus 6AB and address signals aB0 to aB3 are supplied from the outside through the bus 11AB as shown in FIG. 18A.

FIG. 18B shows the case where there is no access conflict in DRAM macro structure as a subject of access, that is, the case where access occurs in different DRAM macro structures. In this case, the two DRAM macro structures as a subject of access operate concurrently and independently. FIG. 18C shows the case where there is access conflict in DRAM macro structure as a subject of access and the case where access priority is given to the address input aB, that is, the case where access occurs in one and the same DRAM macro structure. With respect to the first access request, the addresses aA0 and aB0 conflict with each other. Access to the address aA conflicts with the other priority access from the beginning. Accordingly, access to the address aA is put in a wait state until all operations for the address aB terminate. FIG. 18D shows the case where there is access conflict in DRAM macro structure as a subject of access and the case where access priority is given to the address input aA, that is, the case where access occurs in one and the same DRAM macro structure. In this case, cache-miss occurs in the first access aA0. In the period of replacement or cache-fill of a cache entry for the cache-miss, the preceding data dB0 and dB1 are read out because access to the addresses aB0 and aB1 does not conflict with access to the address aA. Access to data dA0 and access to data dA1 following the data dA0 and concerning cache-hit have priority to access to addresses aB2 and aB3. Waiting for access to the data dB2 and dB3 is made until access to the data dA1 terminates.

From the above description, in a system LSI in which a plurality of DRAM macro structures are embedded, non-blocking multi-access can be performed for a plurality of access requests without access conflict in the DRAM macro structures so that one access does not block the other access. When, for example, access from the outside is performed by control of a DMAC not shown, access to a DRAM macro structure by the CPU 1 is permitted within a range in which the operation of the CPU 1 is not stopped and in which there is no obstacle to access from the outside. This contributes to enhancement of data processing efficiency.

Figure 19:
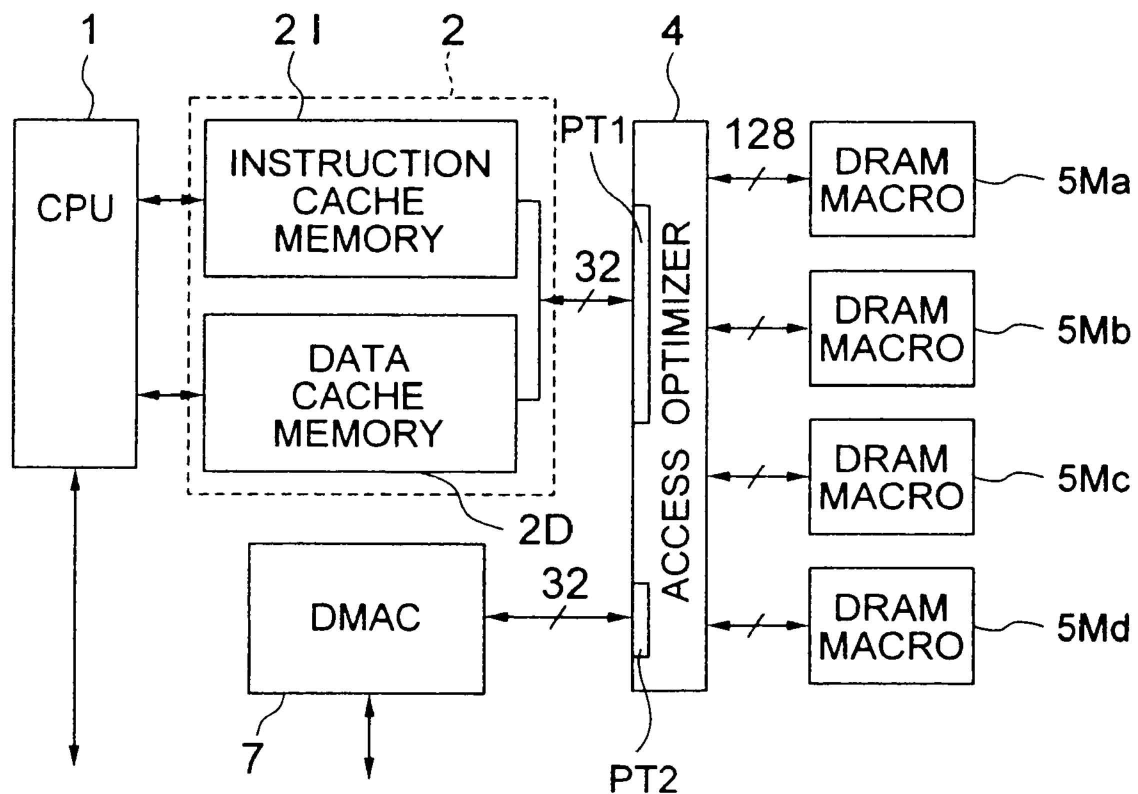
FIG. 19 is a block diagram schematically showing another example of the system LSI in terms of non-blocking multi-access to non-conflicting DRAM macro structures.

From a point of view of the non-blocking multi-access without access conflict in DRAM macro structures, the system LSI can be configured as shown in FIG. 19. The DMAC 7 is connected to the second port PT2. Data input/output of the first port PT1 is set as 32 bits. The first level cache memory 2 is not constituted by a unified cache memory but separated into an instruction cache memory 2I and a data cache memory 2D. Although no path but data paths is shown in FIG. 19, address paths will be able to be inferred from FIG. 1 easily.

Incidentally, functional blocks in the configuration of FIG. 19 may be provided as LSIs respectively so that a data processing system can be configured by multi-chips. Further, in the aforementioned access method, there is some case where latency from the address input of the access optimizer to the data output is not constant in accordance with the access conditions. In this case, an SRAM interface may be used as the interface for the access ports PT1 and PT2 so that the system can be connected to an existing system easily even in the case where the system is used in combination with the existing system. For this purpose, the access optimizer 4 may be formed so as to output a wait signal in a period of from the address input to the data output.

<Write without Data Readout in Second Level Cache Memory Composed of DRAM Macro Structures>

Write without data readout in DRAM banks in DRAM macro structures provided specially as a second level cache memory in a system LSI will be described below. Generally, when data are to be written in DRAM, data are once read out from memory cells to sense amplifiers and a part of data is then rewritten. That is, read modify write is performed. When the sense amplifier cache function of the DRAM macro structures is used as a second level cache memory, there is no necessity of performing read modify write because data are managed by word lines. Therefore, for write, an operation of reading data to the sense amplifiers is not performed and write data are transferred from the main amplifiers to the bit lines at the same time or just after rising of the word line. In this manner, one-word-line's data are written at a high speed.

With respect to the data write mode, the DRAM bank timing generator 54 for achieving the aforementioned write without data readout has a first operation mode (write without data readout mode) for activating the sense amplifier at first timing after selection of the word line, and a second operation mode (refresh mode) for activating the sense amplifier at second timing slower than the first timing after selection of the word line. Though not limited specifically, the first operation mode is set by asserting the column command CC just after asserting the write-enable signal WE and the row command CR. In the first operation mode, the column address signal is provided together with the column command CC. Though not limited specifically, the second operation mode is set by negating the write-enable signal WE and asserting the row command CR. In the second operation mode, the refresh address (row address) is provided together with the row command CR. Column access is unnecessary for the refreshing operation.

Figure 20:
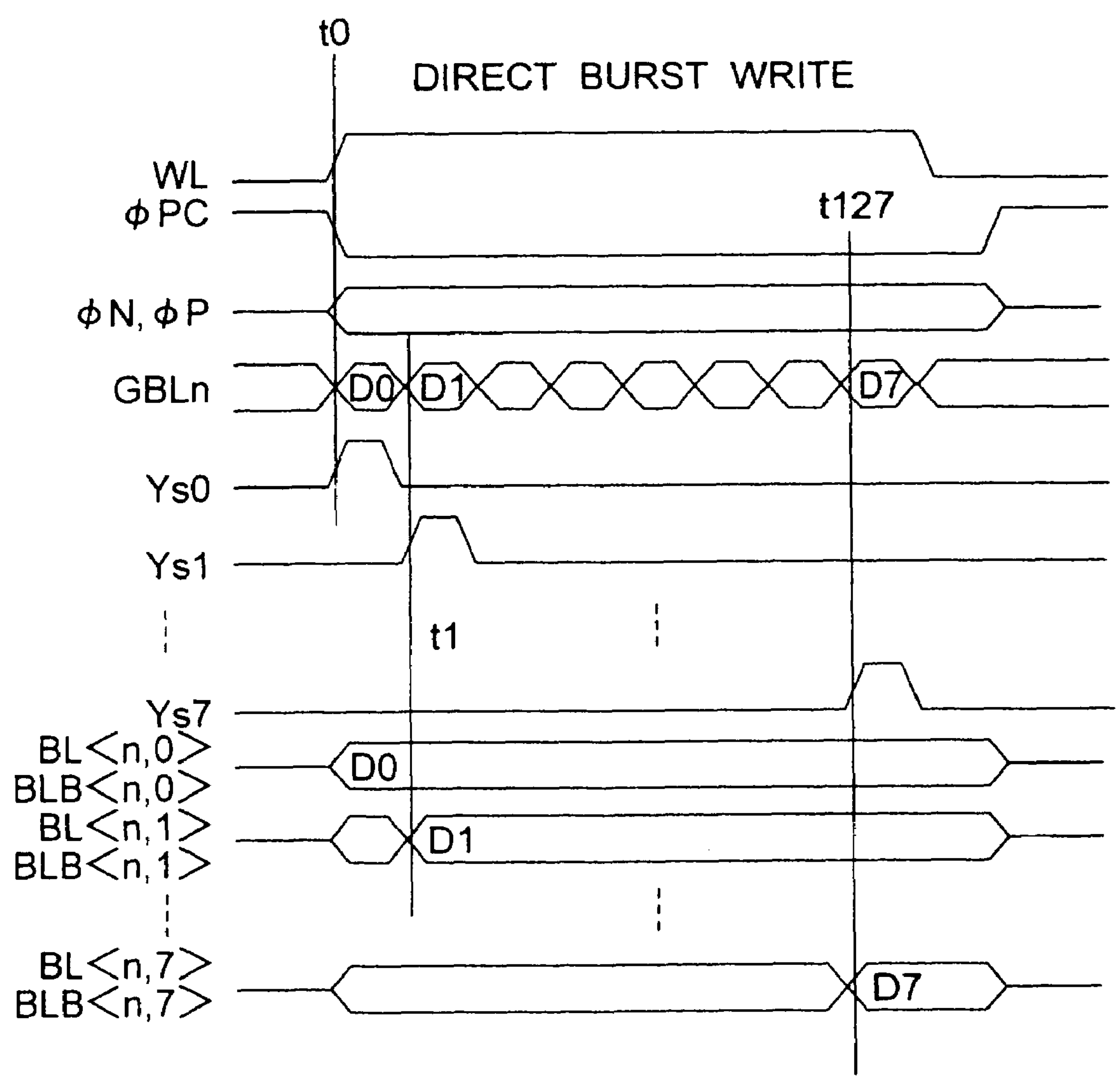
FIG. 20 is a timing chart showing an operational example of a direct burst write mode which is an example of a write without data readout mode.

FIG. 20 shows an example of an operation timing chart in a direct burst write mode as an example of the write without data readout mode. Just after a word line WL is selected at time t0, electric sources ϕN and ϕP for sense amplifiers are switched on so that the sense amplifiers are activated. Further, first 128-bit write data D0 are input from the global bit line GBL to the 128-bit local bit line BL through the column switch circuit 52 on the basis of the column selection signal Ys0. The input 128-bit write data D0 are latched by corresponding 128 sense amplifiers. The potential condition of a corresponding local bit line BL is determined in accordance with the latched data. Thereafter, the same write operation as described above is continued in a period of from time μl to time t127. Finally, data are written in 1024-bit memory cells with respect to one word line.

Figure 21:
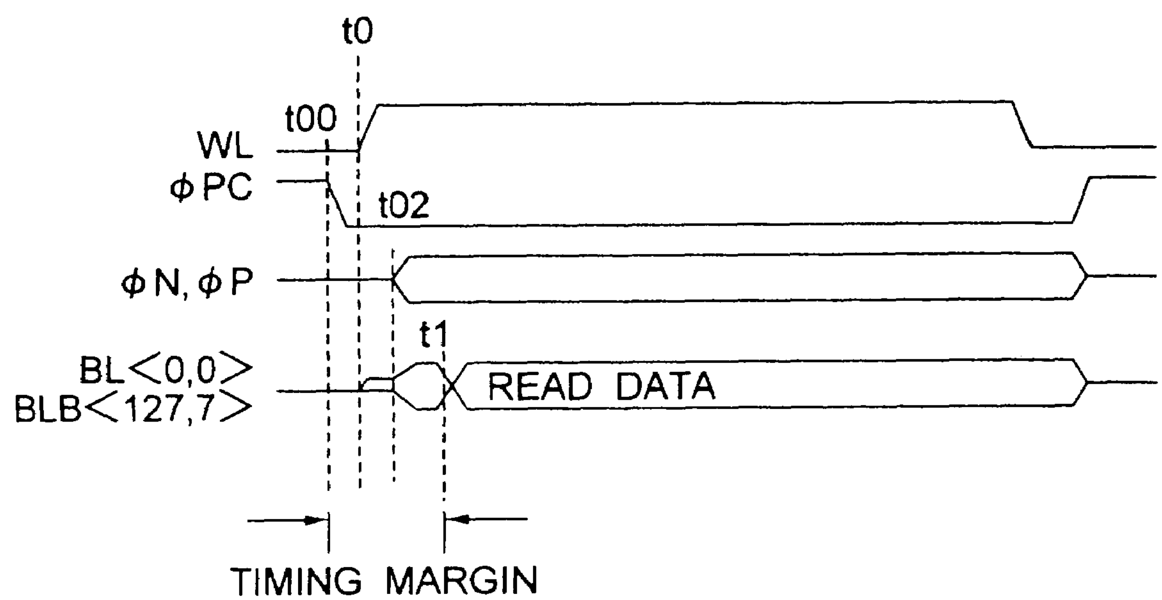
FIG. 21 is a timing chart showing an operational example of a refresh mode.

FIG. 21 shows an example of an operation timing chart in the refresh mode. In the refreshing operation, read modify write must be performed from the nature of the operation for refreshing storage information. Accordingly, a precharging operation terminates at time t00. A word line selecting operation is performed at time t01. After a differential voltage based on electric charge information supplied from memory cells to the local bit line BL by the word line selecting operation becomes large to a certain degree, the sense amplifiers are activated at time t02. Information stored in the memory cells is latched by the sense amplifiers at time t1. As a result, the local bit line BL is driven so that information stored in the memory cells are refreshed on the basis of the electric charge information. In this operation, a timing margin is taken in a period of from time t00 to time t01.

Figure 22:
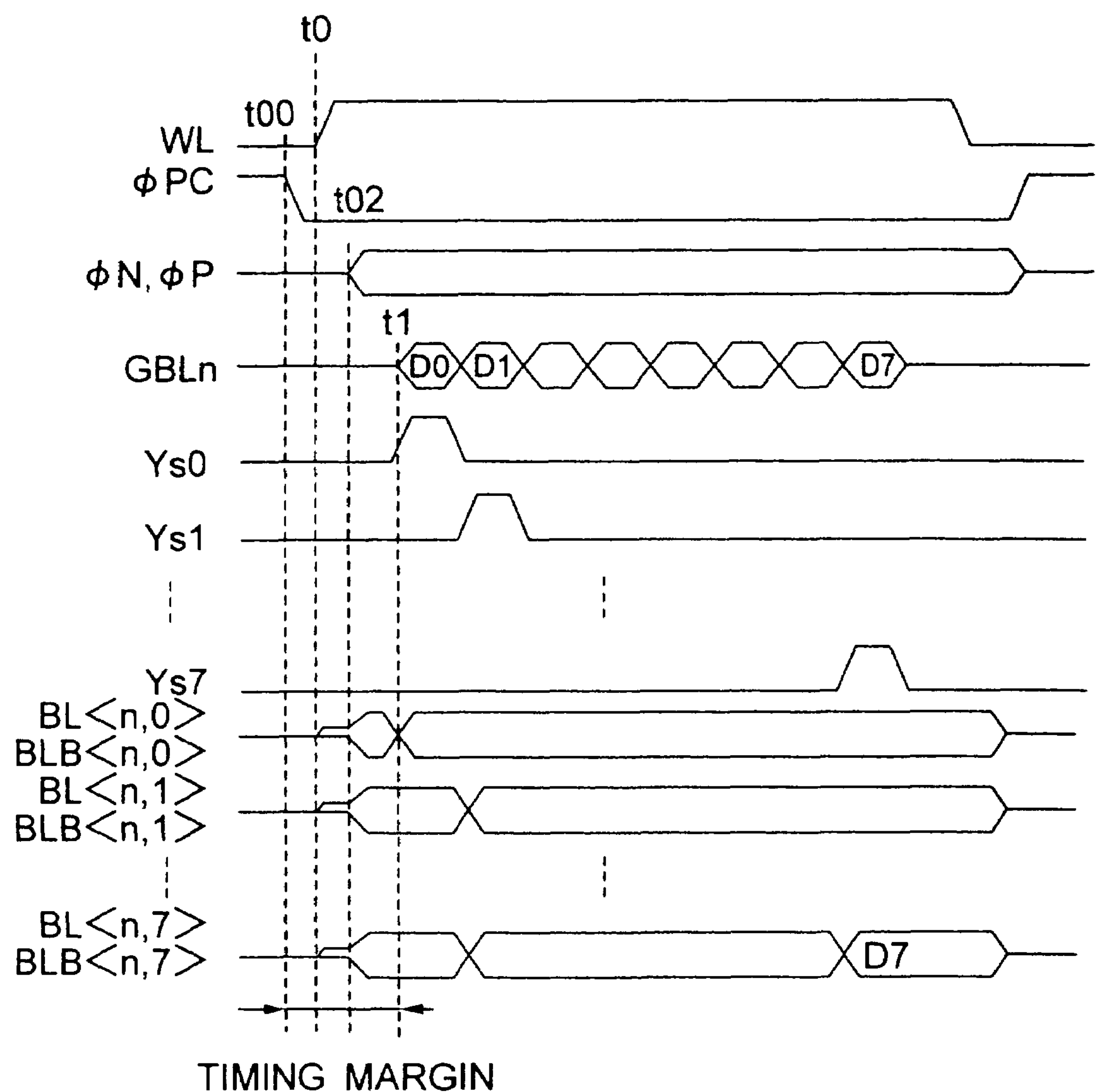
FIG. 22 is a timing chart showing a comparative example of operation timing on the assumption that read modify write is applied also to one-word-line's writing.

If not only data write by word line but also a write operation for a part of one-word-line's memory cells are supported, read modify write is required as well as the refreshing operation. This is because data in other memory cells than memory cells as a subject of write must not be destroyed even in the case where a word line is selected. If read modify write is used for one-word-line's writing, the same timing margin as in the refreshing operation is added to the access time as shown in FIG. 22. As a result, the write time becomes long compared with FIG. 20.

Although the present invention provided by the inventor has been described specifically on the basis of embodiments thereof, it is a matter of course that the invention is not limited thereto but may change variously without departing from the gist thereof.

For example, the number of DRAM macro structures and the number of DRAM banks contained in every DRAM macro structure are not limited to the aforementioned example and can be changed suitably. Further, the kind and number of circuit or function modules contained in the semiconductor integrated circuit represented by the system LSI are not limited to the aforementioned example. An address conversion buffer may be contained or a DSP may be embedded. Although the above description has been made upon the case where DRAM macro structures and DRAM banks are used as an example of the large-capacity memory, the memory macro structures and the memory banks are not limited to the DRAM type except embodiments concerning write without data readout. For example, SRAM (Static Random Access Memory), or the like, may be used as the large-capacity memory. Further, embodiments concerning address self-prefetching and non-blocking multi-access are not limited to the form of specific use of the memory macro structures as a second level cache in which data are managed by word lines. It is a matter of course that the invention can be applied also to the case where the memory macro structures are used as a main memory simply.

The effects obtained by the aforementioned embodiments will be described in brief.

That is, the hit ratio of the sense amplifier cache can be enhanced by the next address self-prefetching.

When replacement of a cache entry is performed because of cache-miss of a set associative type first level cache memory, the lowering of the operating efficiency of multi-bank DRAM can be prevented.

The speed of first access for a multi-bank memory can be enhanced.

For a plurality of access requests in the case where an access request from the CPU to the memory macro structures and an access request from the outside to the memory macro structures do not conflict with each other, non-blocking multi-access can be made so that one access does not block the other access.

Data rewriting for a multi-bank DRAM using a cache line as a word line unit can be performed more efficiently.

What is claimed is:

1. A semiconductor device comprising:

a memory cell array having a plurality of word lines, a plurality of bit lines across the plurality of word lines, and a plurality of memory cells provided at intersections of the plurality of word lines and the plurality of bit lines;

a plurality of sense amplifiers connected to the plurality of bit lines; and a plurality of column switches connected to the plurality of bit lines, wherein in a first mode, all memory cells connected to a first word line included in the plurality of word lines are written with data during activation of the first word line, wherein in a second mode, a predetermined number of memory cells connected to the first word line are written with data during activation of the first word line, wherein a time from activating the first word line to activating the column switches in the first mode is shorter than that in the second mode.

2. A semiconductor device according to claim 1, wherein each of the plurality of column switches is controlled by corresponding one of a plurality of column selection signals, wherein all of the plurality of column selection signals are activated sequentially during activation the first word line.

3. A semiconductor device according to claim 1, further comprising:

a plurality of global bit lines connected to the plurality of column switches;

a plurality of main amplifiers connected to the plurality of global bit lines, wherein the data written into the plurality of memory cells are outputted from the plurality of main amplifiers.

4. A semiconductor device according to claim 1, wherein the plurality of memory cells are DRAM cells.

5. A semiconductor device according to claim 4, wherein the semiconductor device is used for a second level cache.

6. A semiconductor device according to claim 1, wherein the plurality of column switches are selected after the first word line is selected without waiting for activation of the plurality of sense amplifiers.

7. A semiconductor device according to claim 1, wherein the plurality of column switches are selected at the same timing of rising of the first word line.

* * * * *